(12) United States Patent
Kusuda et al.

(10) Patent No.: US 6,885,815 B2
(45) Date of Patent: Apr. 26, 2005

(54) THERMAL PROCESSING APPARATUS PERFORMING IRRADIATING A SUBSTRATE WITH LIGHT

(75) Inventors: Tatsufumi Kusuda, Kyoto (JP); Yuko Ikumi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 10/620,874

(22) Filed: Jul. 16, 2003

(65) Prior Publication Data

US 2004/0013418 A1 Jan. 22, 2004

(30) Foreign Application Priority Data

| Jul. 17, 2002 | (JP) | P2002-208300 |
| Feb. 19, 2003 | (JP) | P2003-041334 |
| Mar. 17, 2003 | (JP) | P2003-071712 |

(51) Int. Cl.$^7$ ................................................ F26B 19/00
(52) U.S. Cl. ................ 392/416; 392/418; 219/390; 219/405; 219/411; 118/724; 118/725; 118/50.1
(58) Field of Search .................. 219/390, 405, 219/411; 392/416, 418; 118/724, 725, 50.1

(56) References Cited

U.S. PATENT DOCUMENTS

| 4,525,380 A | * | 6/1985 | Arai et al. .................. 438/787 |
| 4,649,261 A | | 3/1987 | Sheets |

FOREIGN PATENT DOCUMENTS

| JP | 57-162340 | 10/1982 |
| JP | 59-169125 | 9/1984 |
| JP | 60-258928 | 12/1985 |
| JP | 63-166219 | 7/1988 |
| JP | 11-135449 | * 5/1999 |

OTHER PUBLICATIONS

English translation of portion of Japanese Patent Application Laid–Open No. 11–135449 relevant to the instant application.
English translation of portion of Japanese Patent Application Laid–Open No. 63–166219 relevant to the instant application.
English translation of portion of Japanese Patent Application Laid–Open No. 57–162340 relevant to the instant application.

* cited by examiner

Primary Examiner—Shawntina Fuqua
(74) Attorney, Agent, or Firm—Ostrolenk, Faber, Gerb & Soffen, LLP

(57) ABSTRACT

A plurality of flash lamps are covered with a reflector. Optical fiber members are attached to the reflector on portions located immediately above the flash lamps. When the flash lamps emit flash light toward a semiconductor wafer, the optical fiber members partially guide the emitted light so that a CCD measures the intensity of light emitted from each of the plurality of flash lamps. A computer detects the emission state of each of the plurality of flash lamps on the basis of a result of measurement. At this time, the computer compares standard luminous intensity obtained when the irradiation state on the semiconductor wafer satisfies a prescribed criterion with the luminous intensity in actual processing for detecting the emission states of the plurality of flash lamps. Thus provided is a thermal processing apparatus capable of reliably and simply detecting deterioration of lamps.

17 Claims, 20 Drawing Sheets

F I G . 7
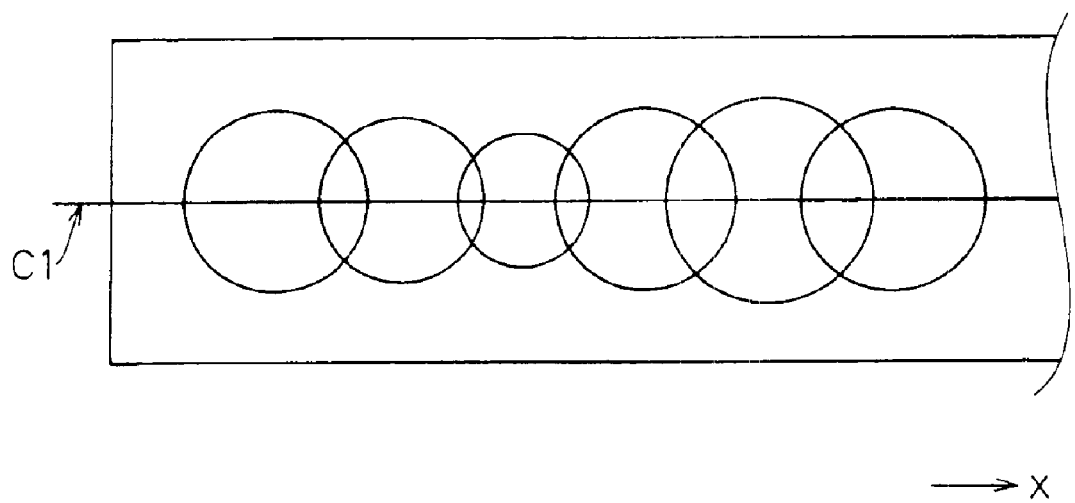

THERMAL PROCESSING APPARATUS PERFORMING IRRADIATING A SUBSTRATE WITH LIGHT

BACKGROUND OF THE INVENTION

1. Field of the Invention

The present invention relates to a thermal processing apparatus irradiating a semiconductor wafer or a glass substrate (hereinafter simply referred to as "substrate") with light thereby thermally processing the substrate.

2. Description of the Background Art

In general, a thermal processing apparatus such as a lamp annealing apparatus using a halogen lamp is employed in an ion activation step for an ion-implanted semiconductor wafer. This thermal processing apparatus heats (anneals) the semiconductor wafer to a temperature of about 1000° C. to 1100° C., for example, thereby activating the ions implanted into the semiconductor wafer. This thermal processing apparatus utilizes energy of light emitted from the halogen lamp thereby increasing the temperature of the substrate at a rate of about hundreds of degrees per second. The thermal processing apparatus utilizing such photoirradiation may monitor deterioration of the lamp with a photosensor.

However, it has been proved that the profile of the ions implanted into the semiconductor wafer is rounded, i.e., the ions are diffused by heat when the ion activation step for the semiconductor wafer is carried out with the thermal processing apparatus increasing the temperature of the substrate at the rate of about hundreds of degrees per second. When such a phenomenon takes place, the implanted ions are diffused even if the same are implanted into the surface of the semiconductor wafer in high concentration, and hence the ions must disadvantageously be implanted beyond necessity.

In order to solve the aforementioned problem, there has been proposed a technique of irradiating the surface of a semiconductor wafer with flash light through xenon flash lamps or the like thereby increasing the temperature of only the surface of the ion-implanted semiconductor wafer in an extremely short time (not more than several ms.). When the surface of the semiconductor wafer is heated through the xenon flash lamps in an extremely short time, only ion activation can be executed without rounding the profile of ions implanted into the semiconductor wafer due to an insufficient time for diffusion of the ions.

If a lamp unit having a plurality of such xenon flash lamps is not at all managed, however, deterioration of none of the xenon flash lamps can be detected in the lamp system as a whole but it follows that processing of the semiconductor wafer is continued while the quantity of light is reduced immediately under the deteriorated lamp. Consequently, it follows that semiconductor wafers partially causing processing abnormality in the surfaces thereof are disadvantageously produced in a large quantity.

Therefore, it is important to mange the xenon flash lamps to ameliorate or prevent the aforementioned drawbacks of the prior art. Presently there has been no concept of control in relation to the xenon flash lamps emitting flash light by instantaneously discharging energy of capacitors storing charges. Lamp management itself has been extremely difficult.

Indirect management by periodically sampling and inspecting processed wafers has generally been frequently employed as a method of managing xenon flash lamps. More specifically, whether proper thermal processing has been performed is inspected by taking out about one processed wafer per several lots and measuring the sheet resistance of the surface thereof. Even if an abnormality is recognized as a result of the inspection of this method, there is a high possibility that a large number of semiconductor wafers processed between the inspections suffer from processing abnormalities. Thus, this method is risky.

There has also been proposed a method of monitoring current characteristics in flash light irradiation thereby detecting abnormality of flash lamps. However, factors for deterioration of flash lamps include various ones such as blacking of glass tubes resulting from sputtering of electrodes, and it is impossible to detect such deterioration of flash lamps resulting from such a phenomenon by monitoring current characteristics.

SUMMARY OF THE INVENTION

The present invention is directed to a thermal processing apparatus irradiating a substrate with light thereby heating the substrate.

According to the present invention, the thermal processing apparatus comprises a light source having a flash lamp, a holding element holding a substrate, a light intensity measuring element measuring the intensity of light emitted from the flash lamp when the light source emits the light toward the substrate held by the holding element and an emission state detection element detecting the emission state of the flash lamp on the basis of a result of measurement by the light intensity measuring element.

When the light source emits light toward the substrate held by the holding element, the light intensity measuring element measures the intensity of the light emitted from the flash lamp so that the emission state detection element detects the emission state of the flash lamp on the basis of the result of measurement, whereby it follows that the light emitted from the flash lamp is directly monitored so that deterioration of the lamp can be reliably and simply detected.

According to an aspect of the present invention, the thermal processing apparatus comprises a light source having a plurality of lamps, a holding element holding a substrate, a light intensity measuring element measuring the intensity of light components emitted from a plurality of portions of each of the plurality of lamps and an emission state detection element detecting the emission state of each of the plurality of lamps on the basis of results of measurement by the light intensity measuring element.

The light intensity measuring element measures the intensity of the light components emitted from the plurality of portions of each of the plurality of lamps so that the emission state detection element detects the emission state of each of the plurality of lamps on the basis of the results of measurement, whereby it follows that the light components emitted from the lamps are directly monitored so that deterioration of the lamps can be reliably and simply detected.

According to another aspect of the present invention, the thermal processing apparatus comprises a light source having a plurality of flash lamps, a holding element holding a substrate, a light intensity measuring element receiving light components emitted from the plurality of flash lamps by a photodetector when the light source emits light toward the substrate held by the holding element for measuring the intensity of the received light components and an emission state detection element detecting the emission state of each of the plurality of flash lamps on the basis of a result of measurement by the light intensity measuring element, while the light intensity measuring element has a plurality of light introduction parts guiding the light components emitted from the plurality of flash lamps and an imaging part provided between first ends of the plurality of light introduction parts opposed to second ends facing the plurality of flash lamps and the photodetector for imaging introduced light components received from the plurality of flash lamps, guided to the introduction parts through the second ends and emitted from the first ends on the photodetector, and the resolution of the imaging part is so adjusted as to enable identification of the introduced light components received from the plurality of flash lamps imaged on the photodetector respectively.

The resolution of the imaging part is so adjusted as to enable identification of the introduced light components received from the plurality of flash lamps imaged on the photodetector respectively, whereby the light intensity of an image of each introduced light component formed on the photodetector can be averaged. Thus, repeatability of the results of measurement by the light intensity measuring element can be improved, whereby repeatability of the result of detection of the emission state of each of the plurality of flash lamps detected on the basis of the results of measurement can be improved for correctly determining the emission state.

Accordingly, an object of the present invention is to provide a thermal processing apparatus capable of reliably and simply detecting deterioration of a lamp.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 illustrates images formed on an exit plane of a filter when the flash lamps emit flash light;

DESCRIPTION OF THE PREFERRED EMBODIMENTS

Embodiments of the present invention are now described in detail with reference to the drawings.

<1. First Embodiment>

Figure 1:
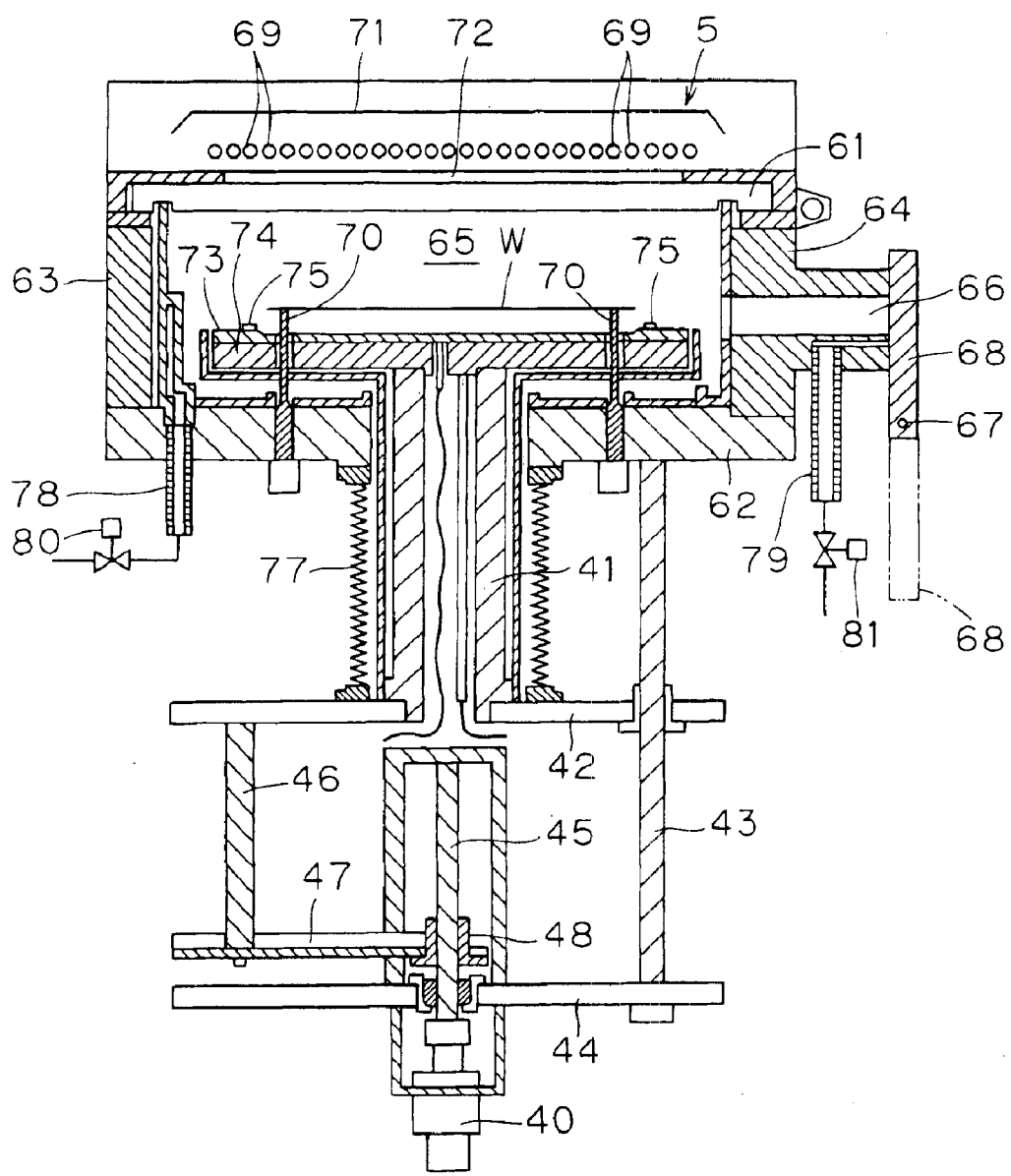
FIGS. 1 and 2 are side sectional views showing the structure of a thermal processing apparatus according to a first embodiment of the present invention.
Figure 2:
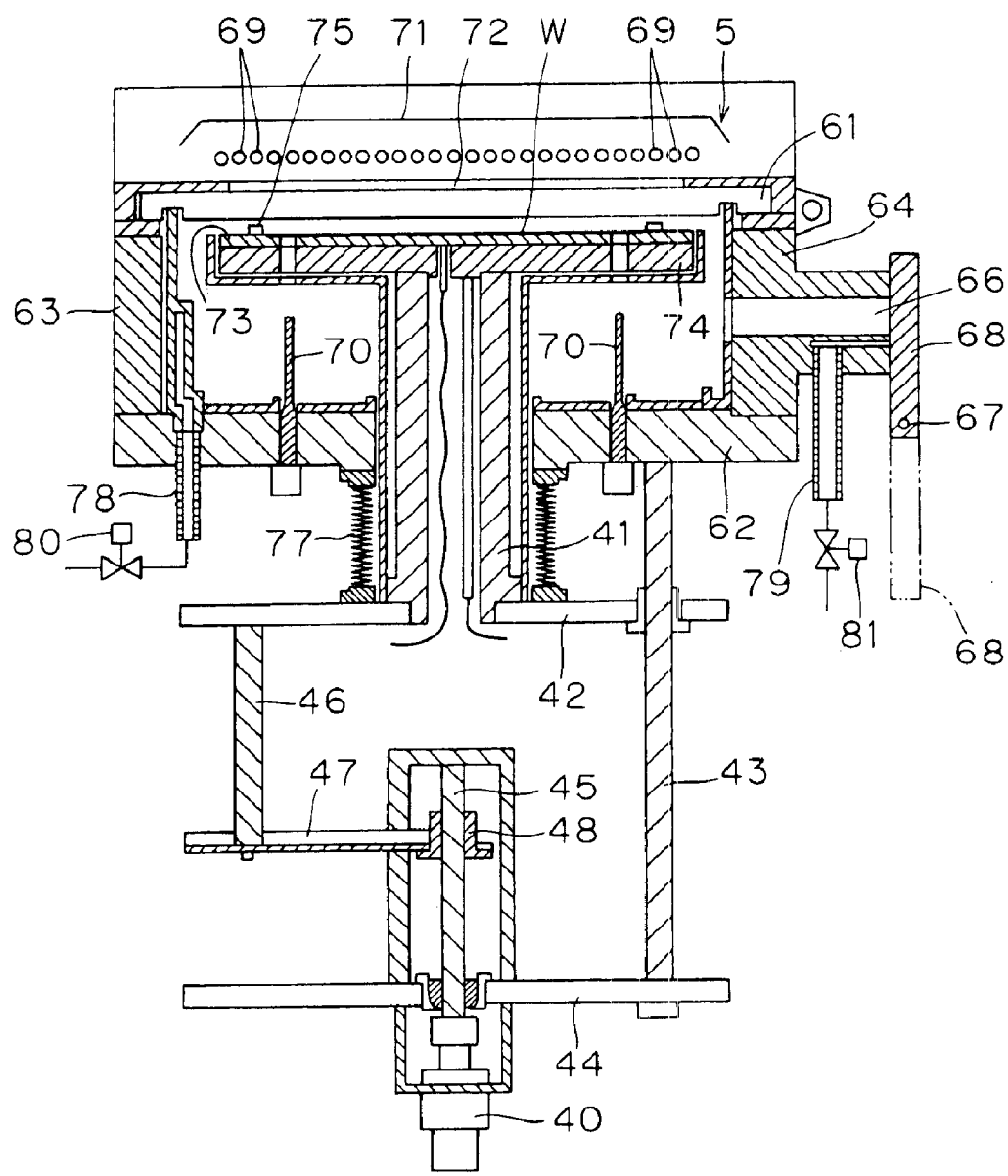

FIGS. 1 and 2 are side sectional views showing the structure of a thermal processing apparatus according to a first embodiment of the present invention. This thermal processing apparatus thermally processes a substrate such as a semiconductor wafer with flash light emitted from xenon flash lamps.

This thermal processing apparatus comprises a chamber 65 formed by a translucent plate 61, a bottom plate 62 and a pair of side plates 63 and 64 for storing and thermally processing a semiconductor wafer W therein. The translucent plate 61 forming the upper portion of the chamber 65 is made of a material such as quartz, for example, having infrared-transparency, and serves as a chamber window transmitting light emitted from a light source 5 and guiding the same into the chamber 65. Support pins 70 are uprightly provided on the bottom plate 62 forming the chamber 65 for passing through a thermal diffusion plate 73 and a heating plate 74 described later and supporting the semiconductor wafer W from below the lower surface.

The side plate 64 forming the chamber 65 is provided with an opening 66 for introducing and discharging the semiconductor wafer W into and from the chamber 65. The opening 66 is openable/closable by a gate valve 68 rotating about an axis 67. A transport robot (not shown) introduces the semiconductor wafer W into the chamber 65 while the opening 66 is released. The gate valve 68 closes the opening 66 when the semiconductor wafer W is thermally processed in the chamber 65.

The chamber 65 is provided under the light source 5. The light source 5 comprises a plurality of (27 in this embodiment) xenon flash lamps 69 (hereinafter also simply referred to as "flash lamps 69") and a reflector 71. The plurality of flash lamps 69, which are bar lamps each having a long cylindrical form, are arranged in parallel with each other longitudinally along the horizontal direction. The reflector 71 is arranged above the plurality of flash lamps 69 to entirely cover these flash lamps 69.

Each xenon flash lamp 69 comprises a glass tube filled with xenon gas and provided on both ends with an anode and a cathode connected to a capacitor and a trigger electrode wound on the outer periphery of the glass tube. The xenon gas is electrically an insulator, and hence no electricity flows in the glass tube in an ordinary state. When a high voltage is applied to the trigger electrode for dielectric breakdown, however, electricity stored in the capacitor instantaneously flows in the glass tube for heating the xenon gas with current Joule heat and discharging light. This xenon flash lamp 69, converting previously stored electrostatic energy to an extremely short optical pulse of 0.1 ms to 10 ms, can emit extremely intense light as compared with a continuously burning light source. According to this embodiment, the thermal processing apparatus is provided with a mechanism (omitted in FIGS. 1 and 2 for convenience of illustration) measuring the intensity of the light emitted from the flash lamps 69, as described later in detail.

A light diffusion plate 72 is arranged between the light source 5 and the translucent plate 61. This light diffusion plate 72 is prepared by performing light diffusion processing on the surface of a silica glass member employed as an infrared-transparent material.

Part of the light radiated from the flash lamps 69 is directly transmitted through the light diffusion plate 72 and the translucent plate 61 and directed into the chamber 65. Another part of the light radiated from the flash lamps 69 is temporarily reflected by the reflector 71 and thereafter transmitted through the light diffusion plate 72 and the translucent plate 61 to be directed into the chamber 65.

The heating plate 74 and the thermal diffusion plate 73 are provided in the chamber 65. The thermal diffusion plate 73 is bonded to the upper surface of the heating plate 74. Displacement preventing pins 75 for the semiconductor wafer W are provided on the surface of the thermal diffusion plate 73.

The heating plate 74 is employed for preheating (assist-heating) the semiconductor wafer W. This heating plate 74 is made of aluminum nitride, and stores a heater and a sensor for controlling the heater therein. On the other hand, the thermal diffusion plate 73 is employed for diffusing thermal energy received from the heating plate 74 and uniformly preheating the semiconductor wafer W. This thermal diffusion plate 73 is made of a material such as sapphire ($Al_2O_3$: aluminum oxide) or quartz having relatively small thermal conductivity.

A motor 40 drives the thermal diffusion plate 73 and the heating plate 74 for vertically moving the same between a position for introducing/discharging the semiconductor wafer W into/from the chamber 65 shown in FIG. 1 and a thermal processing position for the semiconductor wafer W shown in FIG. 2.

The heating plate 74 is coupled to a movable plate 42 through a cylindrical body 41. This movable plate 42 is guided by a guide member 43 suspended from the bottom plate 62 of the chamber 65 to be vertically movable. A fixed plate 44 is fixed to the lower end of the guide member 43, and the motor 40 rotating/driving a ball screw 45 is arranged on the central portion of the fixed plate 44. The ball screw 45 is fitted with a nut 48 coupled with the movable plate 42 through coupling members 46 and 47. Therefore, the thermal diffusion plate 73 and the heating plate 74 driven by the motor 40 are vertically movable between the position for introducing/discharging the semiconductor wafer W into/from the chamber 65 shown in FIG. 1 and the thermal processing position for the semiconductor wafer W shown in FIG. 2.

The thermal diffusion plate 73 and the heating plate 74 vertically move down to the position for introducing/discharging the semiconductor wafer W into/from the chamber 65 shown in FIG. 1 to be capable of placing the semiconductor wafer W introduced through the opening 66 by the transport robot (not shown) on the support pins 70 or discharging the semiconductor wafer W placed on the support pins 70 through the opening 66. In this state, the upper ends of the support pins 70 pass through through-holes formed in the thermal diffusion plate 73 and the heating plate 74 and project upward beyond the surface of the thermal diffusion plate 73.

On the other hand, the thermal diffusion plate 73 and the heating plate 74 vertically move up to the thermal processing position for the semiconductor wafer W shown in FIG. 2 beyond the upper ends of the support pins 70 for thermally processing the semiconductor wafer W. In the process of upward movement of the thermal diffusion plate 73 and the heating plate 74 from the position for introducing/discharging the semiconductor wafer W into/from the chamber 65 shown in FIG. 1 to the thermal processing position for the semiconductor wafer W shown in FIG. 2, the semiconductor wafer W placed on the support pins 70 is received by the thermal diffusion plate 73, moved up while the lower surface thereof is supported on the surface of the thermal diffusion plate 73, and horizontally held on a position close to the translucent plate 61 in the chamber 65. In the opposite process of downward movement of the thermal diffusion plate 73 and the heating plate 74 from the thermal processing position to the position for introducing/discharging the semiconductor wafer W into/from the chamber 65, the semiconductor wafer W supported by the thermal diffusion plate 73 is transferred to the support pins 70.

When the thermal diffusion plate 73 and the heating plate 74 supporting the semiconductor wafer W move up to the thermal processing position, it follows that the translucent plate 61 is located between the semiconductor wafer W held by the thermal diffusion plate 73 and the heating plate 74 and the light source 5. The current distance between the thermal diffusion plate 73 and the light source 5 can be arbitrarily adjusted by controlling the quantity of rotation of the motor 40.

An elastic bellows 77 for keeping the chamber 65 in an airtight state is arranged between the bottom plate 62 of the chamber 65 and the movable plate 42 to enclose the cylindrical body 41. The bellows 77 contracts when the thermal diffusion plate 73 and the heating plate 74 move up to the thermal processing position while the former expands when the latter move down to the position for introducing/discharging the semiconductor wafer W into/from the chamber 65 for isolating the atmosphere in the chamber 65 from the external atmosphere.

The side plate 63 of the chamber 65 opposite to that provided with the opening 66 is provided with an introduction path 78 communicatively connected to an on-off valve 80. This introduction path 78 is employed for introducing gas such as inactive nitrogen gas, for example, necessary for processing into the chamber 65. On the other hand, the opening 66 provided in the side plate 64 is formed with a discharge path 79 communicatively connected to another on-off valve 81. This discharge path 79, employed for discharging the gas from the chamber 65, is connected with a discharge element (not shown) through the on-off valve 81.

Figure 3:
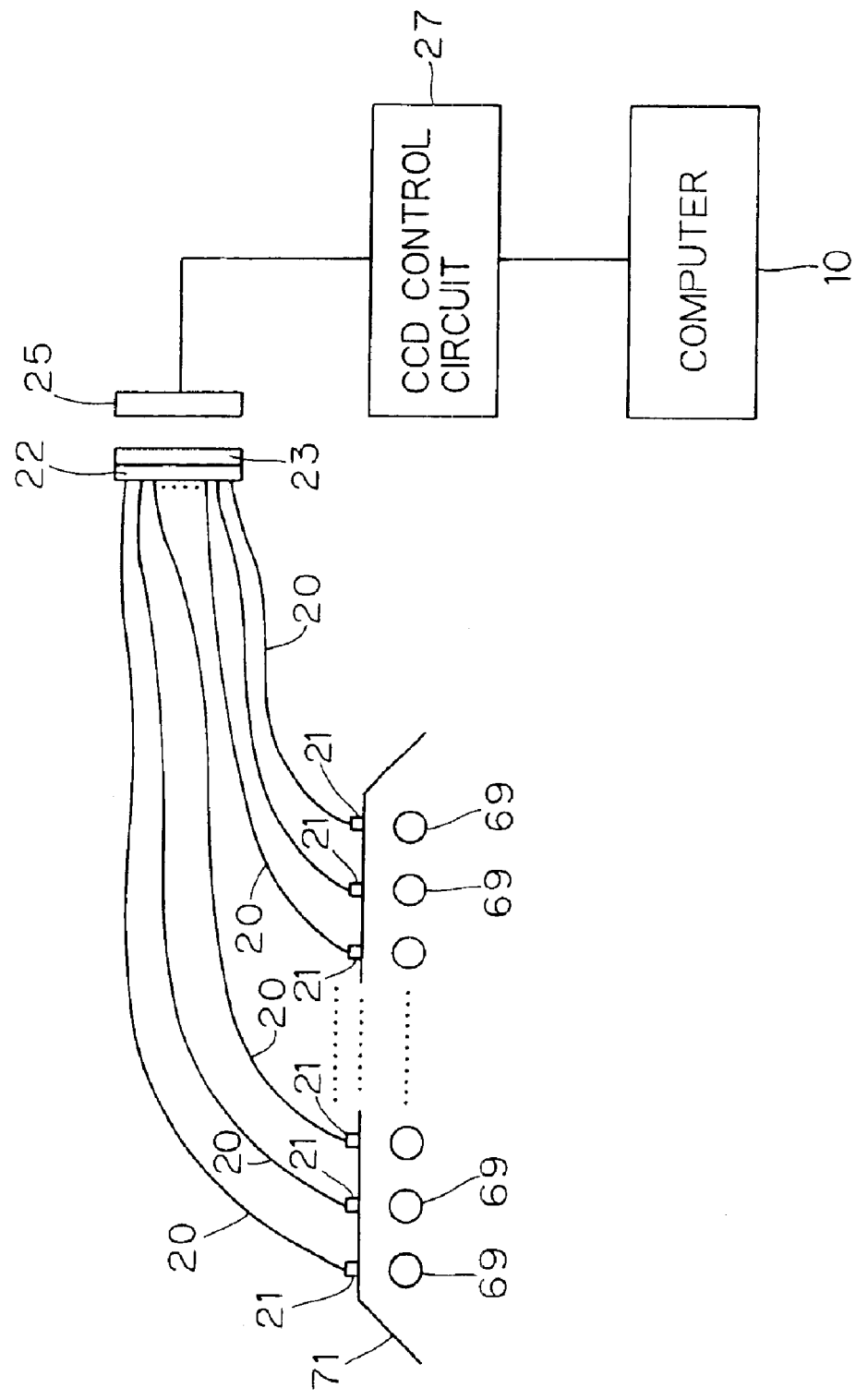
FIG. 3 schematically illustrates the structure of a light intensity measuring mechanism.

As hereinabove described, this thermal processing apparatus is provided with the mechanism measuring the intensity of the light emitted from the flash lamps 69. FIG. 3 schematically illustrates the structure of the light intensity measuring mechanism. This light intensity measuring mechanism is mainly formed by a plurality of optical fiber members 20 guiding the light emitted from the flash lamps 69, a CCD (charge coupled device) 25 outputting the intensity of received light as an electric signal and a computer 10 analyzing the electric signal output from the CCD 25.

Figure 5:
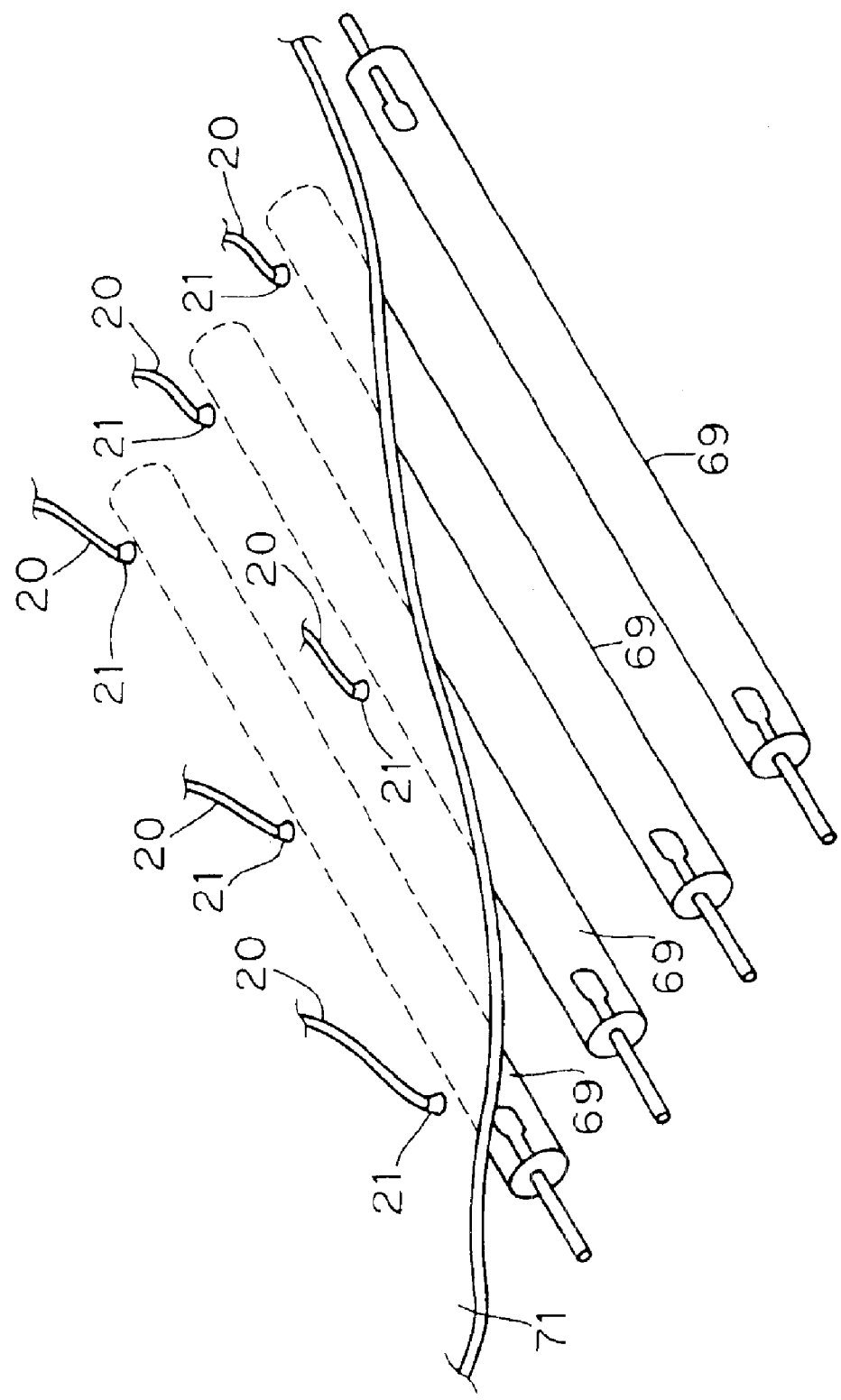
FIG. 5 illustrates the state of arrangement of optical fiber members with respect to flash lamps.
Figure 6:
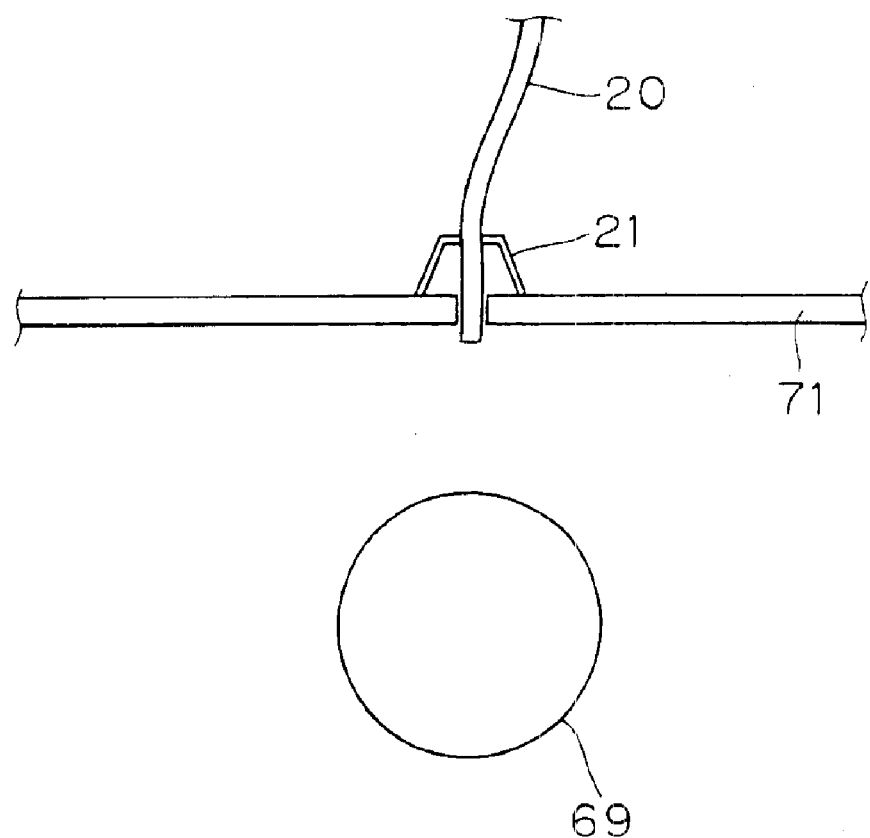
FIG. 6 is an enlarged view showing a mode of attachment of each optical fiber member to a reflector.

First ends of the optical fiber members 20 are fixed to the reflector 71. FIG. 5 illustrates the state of arrangement of the optical fiber members 20 with respect to the flash lamps 69. FIG. 6 is an enlarged view showing a mode of attachment of each optical fiber member 20 to the reflector 71. According to this embodiment, three optical fiber members 20 are arranged for each flash lamp 69 as shown in FIG. 5. The optical fiber members 20 are so formed that end surfaces thereof are opposed to the central portion and both end portions of each flash lamp 69, which is a bar lamp having a long cylindrical form, respectively. Assuming that 27 flash lamps 69 are provided on the light source 5, therefore, it follows that 81 optical fiber members 20 are attached to the reflector 71 in total. More specifically, a hole having a diameter slightly larger than that of each optical fiber member 20 is formed in a portion of the reflector 71 located immediately above each flash lamp 69 for inserting an end of the optical fiber member 20 into this hole and fixing the optical fiber member 20 with a fixture 21, as shown in FIG. 6. The optical fiber member 20 is made of quartz, and resistant against the intense flash light from the flash lamp 69.

As shown in FIGS. 5 and 6, the plurality of, e.g., 81 optical fiber members 20 are so attached to the reflector 71 that the end surfaces thereof are opposed to the central portions and both end portions of the 27 flash lamps 69. When the flash lamps 69 emit flash light in this state, it follows that the emitted light is incident upon the end surfaces of the optical fiber members 20 and guided by the optical fiber members 20.

Second ends of the optical fiber members 20 are fixed to a fiber fixture 22. The plurality of optical fiber members 20 may be connected to (arranged on) the fiber fixture 22 in an arbitrary mode in response to the shape of the CCD 25. For example, the 81 optical fiber members 20 may be aligned with each other, or rectangularly arranged. According to the first embodiment, three trains of 27 optical fiber members 20 opposed to the central portions, first ends and second ends of the flash lamps 69 respectively are fixed to the fiber fixture 22. The light incident upon first end surfaces opposed to the flash lamps 69 and guided through the optical fiber members 20 outgoes from second end surfaces thereof with no hindrance by the fiber fixture 22, as a matter of course.

A filter 23 is bonded to the fiber fixture 22. This filter 23 can be prepared in response to the object thereof. For example, an ND filter may be employed if the light outgoing from the optical fiber members 20 is too intense, or a band-pass filter may be employed in order to narrow the target to a prescribed spectrum. In order to monitor only an ultraviolet spectrum remarkably contributing to flash heating, for example, a band-pass filter narrowing the target to the ultraviolet spectrum is employed. Alternatively, a filter coated with a fluorescent paint can be employed as the filter 23. Further alternatively, the filter 23 may be replaced with a light diffusion plate.

The CCD 25, formed by arranging photodiodes in a planar state, is a photodetector taking out a quantity of electricity proportionate to stored incident light. The CCD 25 arranged oppositely to the fiber fixture 22 can receive the light emitted from the 81 optical fiber members 20 and transmitted through the filter 23. The CCD 25 may alternatively be replaced with a CMOS (complementary metal oxide semiconductor) sensor or the like. A CCD control circuit 27 controls reading of charges stored in the CCD 25. The electric signal read from the CCD 25 by the CCD control circuit 27 is transmitted to the computer 10. The computer 10 provided on the thermal processing apparatus has a hardware structure similar to that of a general computer.

Figure 4:
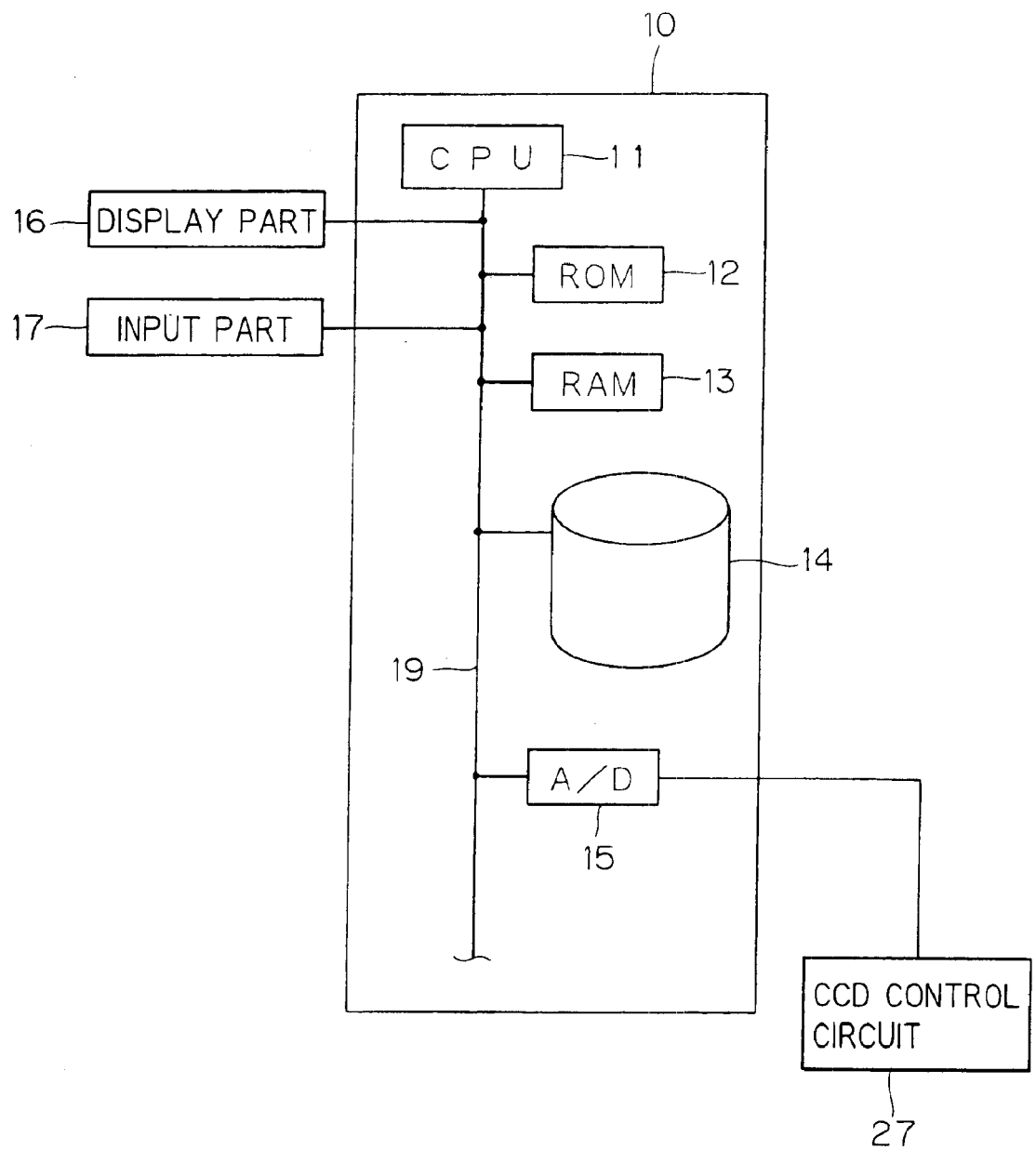
FIG. 4 is a block diagram showing the structure of a computer.

FIG. 4 is a block diagram showing the structure of the computer 10. The computer 10 is formed by connecting a CPU 11 performing various types of operational processing, a ROM (read-only memory) 12 storing a basic program, a RAM (random-access memory) 13 storing various types of information and a magnetic disk 14 storing control software, data etc. to a bus line 19. An A-D converter 15 is also connected to the bus line 19. This A-D converter 15 is a circuit digitally converting the analog electric signal read from the CCD 25 by the CCD control circuit 27.

A display part 16 and an input part 17 are further electrically connected to the bus line 19. The display part 16, formed by a liquid crystal display or the like, for example, displays various types of information such as results of processing and recipe contents. The input part 17, formed by a keyboard and a mouse or the like, for example, accepts inputs of commands and parameters. An operator of the apparatus can input commands, parameters and the like from the input part 17 while confirming contents displayed on the display part 16. The display part 16 and the input part 17 may alternatively be integrated into a touch panel.

Due to the aforementioned structure, the thermal processing apparatus according to the first embodiment can guide the light emitted from the flash lamps 69 through the optical fiber members 20, measure the intensity of the light with the CCD 25 and analyze the obtained results of measurement with the computer 10.

Operations of the thermal processing apparatus having the aforementioned structure for thermally processing the semiconductor wafer W are now described. The semiconductor wafer W processed by the thermal processing apparatus is an ion-implanted semiconductor wafer.

In this thermal processing apparatus, the thermal diffusion plate 73 and the heating plate 74 are arranged on the position for introducing/discharging the semiconductor wafer W into/from the chamber 65 shown in FIG. 1 so that the transport robot (not shown) introduces the semiconductor wafer W into the chamber 65 through the opening 66 and places the same on the support pins 70. When the semiconductor wafer W is completely introduced into the chamber 65, the gate valve 68 closes the opening 66. Thereafter the thermal diffusion plate 73 and the heating plate 74 are driven by the motor 40 to move up to the thermal processing position for the semiconductor wafer W shown in FIG. 2, for horizontally holding the semiconductor wafer W. The on-off valves 80 and 81 are opened for forming a flow of nitrogen gas in the chamber 65.

The thermal diffusion plate 73 and the heating plate 74 are previously heated to a prescribed temperature by the heater stored in the heating plate 74. When the thermal diffusion plate 73 and the heating plate 74 move up to the thermal processing position for the semiconductor wafer W, therefore, the semiconductor wafer W comes into contact with the heated thermal diffusion plate 73 to be preheated so that the temperature of the semiconductor wafer W is gradually increased.

In this state, the thermal diffusion plate 73 continuously heats the semiconductor wafer W. When the temperature of the semiconductor wafer W is increased, a temperature sensor (not shown) regularly monitors whether or not the surface temperature of the semiconductor wafer W reaches a preheating temperature T1.

This preheating temperature T1 is about 200° C. to 600° C., for example. When the semiconductor wafer W is heated to this degree of preheating temperature T1, ions implanted into the semiconductor wafer W are not diffused.

When the surface temperature of the semiconductor wafer W reaches the preheating temperature T1, the flash lamps 69 are burnt for flash heating. In this flash heating step, the flash lamps 69 are burnt for about 0.1 ms to 10 ms. Thus, it follows that the flash lamps 69 converting previously stored electrostatic energy to such an extremely short optical pulse emit extremely intense flash light.

According to such flash heating, the surface temperature of the semiconductor wafer W instantaneously reaches a temperature T2. This temperature T2 is about 1000° C. to 1100° C., which is necessary for ion activation processing for the semiconductor wafer W. The thermal processing apparatus heats the surface of the semiconductor wafer W to such a processing temperature T2, thereby activating the ions implanted into the semiconductor wafer W.

At this time, the surface of the semiconductor wafer W is heated to the processing temperature T2 in the extremely short time of about 0.1 ms to 10 ms, whereby the ions in the semiconductor wafer W are completely activated in a short time. Therefore, the ions implanted into the semiconductor wafer W are not diffused but it is possible to prevent such a phenomenon that the profile of the ions implanted into the semiconductor wafer W is rounded. The time necessary for ion activation is extremely short as compared with a time necessary for diffusion of the ions, and hence ion activation is completed in the short time of about 0.1 ms to 10 ms causing no diffusion.

The thermal processing apparatus heats the surface of the semiconductor wafer W to the preheating temperature T1 of about 200° C. to 600° C. with the heating plate 74 before burning the flash lamps 69 for heating the semiconductor wafer W, whereby it is possible to quickly heat the semiconductor wafer W to the processing temperature T2 of about 1000° C. to 1100° C.

After completion of the flash heating step, the thermal diffusion plate 73 and the heating plate 74 are driven by the motor 40 to move down to the position for introducing/discharging the semiconductor wafer W into/from the chamber 65 shown in FIG. 1 while the opening 66 having been closed by the gate valve 68 is released. The transport robot (not shown) discharges the semiconductor wafer W placed on the support pins 70 from the chamber 65. Thus, a series of thermal processing operations are completed.

In the aforementioned series of thermal processing steps, the thermal processing apparatus according to this embodiment monitors the intensity of the light emitted from the flash lamps 69. This light intensity monitoring operation is now described.

When the flash lamps 69 emit flash light in the aforementioned flash heating, the optical fiber members 20 receive parts of the light. At this time, it follows that the optical fiber member 20 having the end surfaces opposed to the central portions and both ends of the flash lamps 69 individually receive light components emitted from the central portions and both ends of the flash lamps 69 respectively. The received light components are guided and emitted by the optical fiber members 20 and received by the CCD 25 through the filter 23.

FIG. 7 illustrates images formed on an exit plane of the filter 23 when the flash lamps 69 emit flash light. The images shown in FIG. 7 are formed when the light components guided by the optical fiber members 20 opposed to the central portions of the flash lamps 69 pass through the filter 23. Each circle shown in FIG. 7 is an image formed when the light component emitted from a certain flash lamp 69 and guided by the optical fiber members 20 corresponding thereto passes through the filter 23. Thus, the light components emitted from the central portions of the flash lamps 69 individually pass through the filter 23. The CCD 25 measures the quantity of light on a line C1 shown in FIG. 7 and converts the same to the electric signal, which in turn is transmitted to the computer 10.

Figure 8:
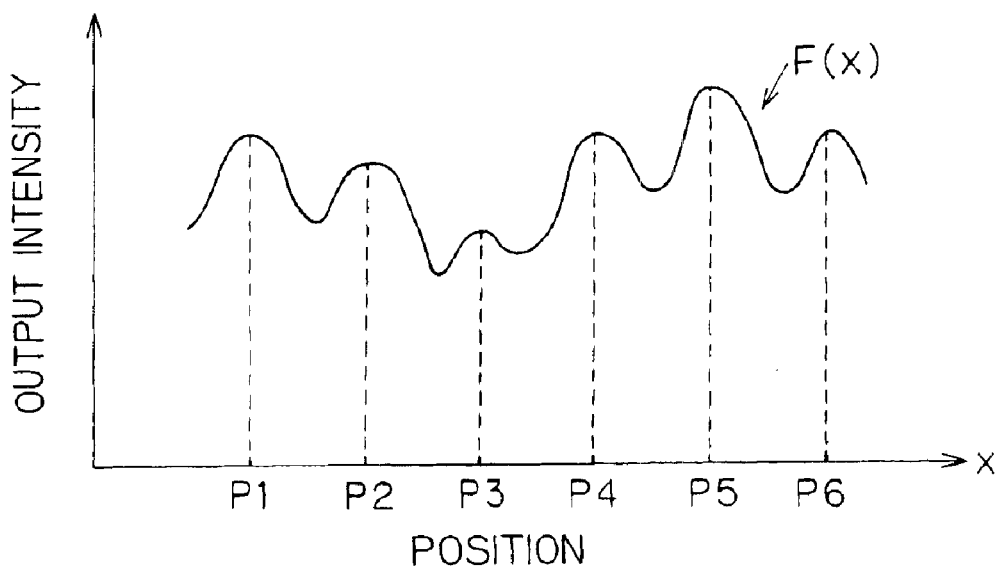
FIG. 8 illustrates an exemplary waveform of an electric signal output from a CCD.
Figure 9:
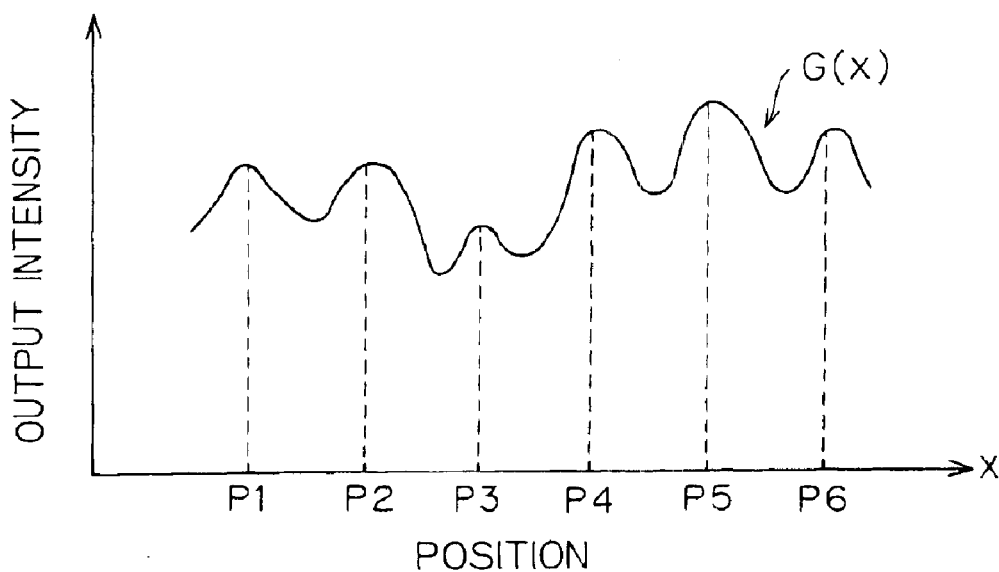
FIG. 9 illustrates another exemplary waveform of an electric signal output from the CCD.

FIGS. 8 and 9 illustrate exemplary waveforms of electric signals output from the CCD 25. Referring to each of FIGS. 8 and 9, the horizontal axis shows cell positions of the CCD 25, and the vertical axis shows the intensity of the electric signal output from the CCD 25. Further, symbols P1 to P6 denote cell positions located on the centers of the light components emitted from the optical fiber members 20 (more correctly, the light components emitted from prescribed portions of the flash lamps 69 to which the optical fiber members 20 are opposed), more specifically, cell positions located on the centers of the circular images shown in FIG. 7. The cell position P1 is located on the center of a light component emitted from the central portion of a flash lamp 69a. Similarly, the cell positions P2, P3, P4, P5 and P6 are located on the centers of light components emitted from the central portions of flash lamps 69b, 69c, 69d, 69e and 69f respectively. In other words, the single CCD 25 measures the intensity of the light components emitted from the respective ones of the plurality of flash lamps 69. Each of the flash lamps 69a to 69f (hereinafter simply referred to as "flash lamps 69" when no distinction is required in particular) is one of the 27 flash lamps 69 provided on the light source 5.

A waveform F(x) shown in FIG. 8 indicates the intensity of the light components emitted from the respective ones of the plurality of flash lamps 69 when an irradiation state on the semiconductor wafer W held on the thermal processing position in the chamber 65 by the thermal diffusion plate 73 and the heating plate 74 satisfies a prescribed criterion. The irradiation state satisfies the prescribed criterion when dispersion of illuminance on the semiconductor wafer W is within a prescribed range, for example. Such a state is implemented by performing adjustment etc. of the flash lamps 69 in installation or maintenance of the thermal processing apparatus. The light intensity measuring mechanism previously measures the intensity of the light components emitted from the plurality of flash lamps 69 when the irradiation state satisfies the prescribed criterion after completion of maintenance or the like, so that the computer 10 stores the waveform F(x) indicating the light intensity in the magnetic disk 14.

When the irradiation state on the semiconductor wafer W satisfies the prescribed criterion, the intensity of the light components emitted from the flash lamps 69 itself may not necessarily be homogeneous. Also when the intensity of the light components emitted from the flash lamps 69a to 69f is dispersed on the waveform F(x) shown in FIG. 8, dispersion of illuminance on the semiconductor wafer W may be within the prescribed range as a result, and the computer 10 previously stores the waveform F(x) indicating the intensity of the light components emitted from the flash lamps 69 at this time as standard luminous intensity.

On the other hand, a waveform G(x) shown in FIG. 9 indicates the intensity of light components emitted from the respective ones of the plurality of flash lamps 69 when the thermal processing apparatus actually performs flash heating on the semiconductor wafer W to be processed. When the thermal processing apparatus performs flash heating, the flash lamps 69 necessarily emit light components and the CCD 25 receives the light components emitted from the flash lamps 69 for obtaining the waveform G(x). In other words, the thermal processing apparatus acquires the waveform G(x) indicating the intensity of the light components emitted from the 27 flash lamps 69 respectively every time performing photoirradiation on the semiconductor wafer W to be processed.

Every time the thermal processing apparatus obtains the waveform G(x), the CPU 11 of the computer 10 compares the same with the waveform F(x) indicating the standard luminous intensity for detecting the emission states of the respective ones of the 27 flash lamps 69. More specifically, the CPU 11 executes the following operation:

$$G(x)/F(x)$$

This means that the CPU 11 performs normalization with the waveform F(x) indicating the standard luminous intensity.

Figure 10:
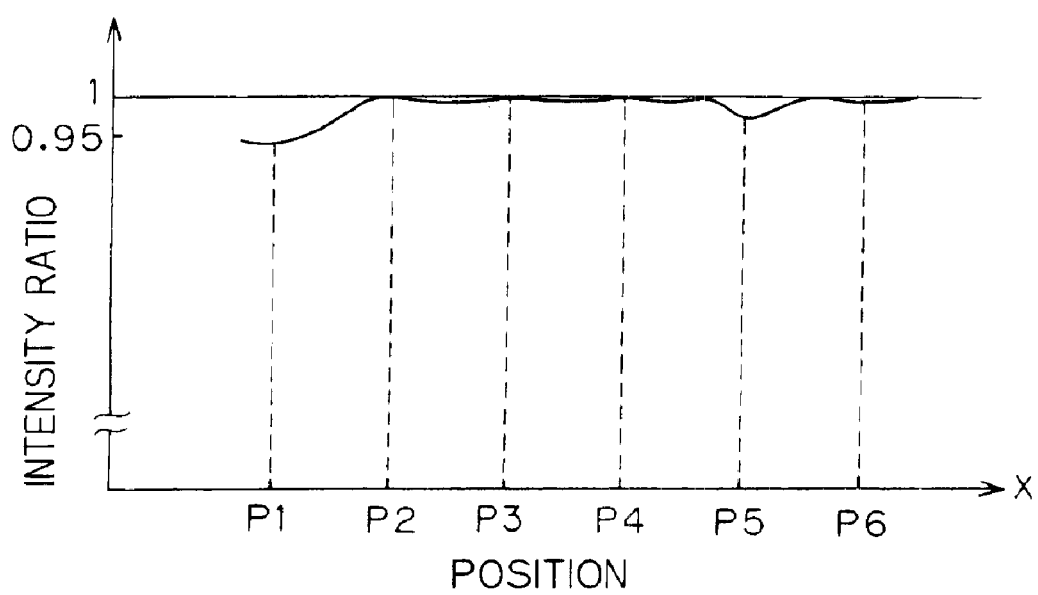
FIG. 10 illustrates the ratio of the intensity, which is standard luminous intensity, of the waveform shown in FIG. 8 to the intensity of the waveform shown in FIG. 9.

FIG. 10 illustrates the ratio of the intensity of the waveform F(x) indicating the standard luminous intensity shown in FIG. 8 to that of the waveform G(x) shown in FIG. 9. As shown in FIG. 10, the intensity levels on the cell positions P1 and P5 in the waveform G(x) are lower than those in the waveform F(x) indicating the standard luminous intensity. This means that the intensity levels of the light components emitted from the flash lamps 69a and 69e are reduced from those at the time of acquisition of the waveform F(x), i.e., the flash lamps 69a and 69e are deteriorated. In particular, the intensity ratio on the cell position P1 is remarkably reduced, and it is obvious that the flash lamp 69a is remarkably deteriorated.

According to the first embodiment, the CPU 11 determines whether or not the intensity ratio shown in FIG. 10 is below 0.98 as to at least one of the 27 flash lamps 69 provided on the light source 5, and issues a warning about deterioration of this flash lamp 69 when the intensity ratio is reduced below 0.98. The CPU 11 may display a warning message on the display part 16 as the warning, for example.

The CPU 11 further determines whether or not the intensity ratio shown in FIG. 10 is below 0.95 as to at least one of the 27 flash lamps 69 provided on the light source 5 and stops the thermal processing apparatus when the same is reduced below 0.95. In the aforementioned example, the intensity ratio as to the flash lamp 69a is not more than 0.95, and hence the CPU 11 determines that the degree of deterioration of the flash lamp 69a is remarkable and stops the thermal processing apparatus. Even if the intensity ratio as to the flash lamp 69e is normal, the CPU 11 determines that deterioration of the flash lamp 69e progresses and displays a warning message on the display part 16 when the intensity ratio as to the flash lamp 69e is not more than 0.98.

The degree of reduction of the intensity ratio shown in FIG. 10 for performing abnormality countermeasure processing may be previously set by investigating what degree of reduction of the intensity ratio damages homogeneity of illuminance distribution on the semiconductor wafer W by an experiment or the like.

When the thermal processing apparatus is stopped, the operator exchanges the deteriorated flash lamp 69. The operator preferably exchanges the deteriorated flash lamp 69 when the CPU 11 issues the warning. When dispersion of illuminance on the semiconductor wafer W is set in the prescribed range as a result of such maintenance, the CCD 25 measures the intensity of the light components emitted from the respective ones of the plurality of flash lamps 69 and stores the waveform F(x) thereof in the computer 10 as new standard luminous quantity.

According to the first embodiment, as hereinabove described, the optical fiber members 20 guide parts of outgoing light and the CCD 25 measures the intensity of the light components emitted from the respective ones of the 27 flash lamps 69 when the light source 5 emits flash light toward the semiconductor wafer W held by the thermal diffusion plate 73 and the heating plate 74. The CPU 11 of the computer 10 detects the emission states of the respective ones of the 27 flash lamps 69 on the basis of results of measurement, thereby monitoring the intensity of the light components emitted from the flash lamps 69. The CPU 11 detects the emission states of the flash lamps 69 not by conventional indirect lamp management such as periodic sampling or monitoring of current characteristics but by directly receiving the light components emitted from the flash lamps 69 and measuring the intensity thereof, whereby direct lamp management is so enabled that deterioration of the flash lamps 69 can be reliably and simply detected.

In detection of the emission states of the flash lamps 69, the CPU 11 previously measures the intensity of the light components emitted from the respective ones of the 27 flash lamps 69 when the irradiation state on the semiconductor wafer W held by the thermal diffusion plate 73 and the heating plate 74 satisfies the prescribed criterion and regards the same as the standard luminous intensity for comparing the intensity of the light components emitted from the respective ones of the 27 flash lamps 69 with this standard luminous intensity when actually flash-heating the semiconductor wafer W to be processed. In other words, the CPU 11 normalizes the intensity of the light components emitted from the respective ones of the 27 flash lamps 69 with the standard luminous intensity when actually performing flash heating thereby detecting the emission states of the flash lamps 69 regardless of presence/absence of dispersion in light intensity among the 27 flash lamps 69, whereby deterioration of the flash lamps 69 can be reliably detected by a simple method.

According to this embodiment, the optical fiber members 20 are opposed not only to the central portions but also to both ends of the flash lamps 69 for also detecting the emission states on both ends. Electrodes are arranged on both ends of the flash lamps 69, and hence light quantity reduction is readily caused by blackening of glass tubes resulting from sputtering of the electrodes. Therefore, it is possible to more reliably detect deterioration of the flash lamps 69 by simultaneously monitoring the intensity of the light components emitted from the plurality of portions including both ends of the flash lamps 69.

The CPU 11 detects the emission states of the respective ones of the 27 flash lamps 69 every time the thermal processing apparatus performs photoirradiation on the semiconductor wafer W to be processed, whereby only a semiconductor wafer W processed when abnormal emission is detected may be defective, and there is no possibility that all semiconductor wafers W processed between inspections are defectively processed dissimilarly to the conventional inspection by sampling.

The single CCD 25 measures the intensity of the light components emitted from the 27 flash lamps 69, whereby dispersion of a measuring circuit can be suppressed to the minimum.

Figure 11:
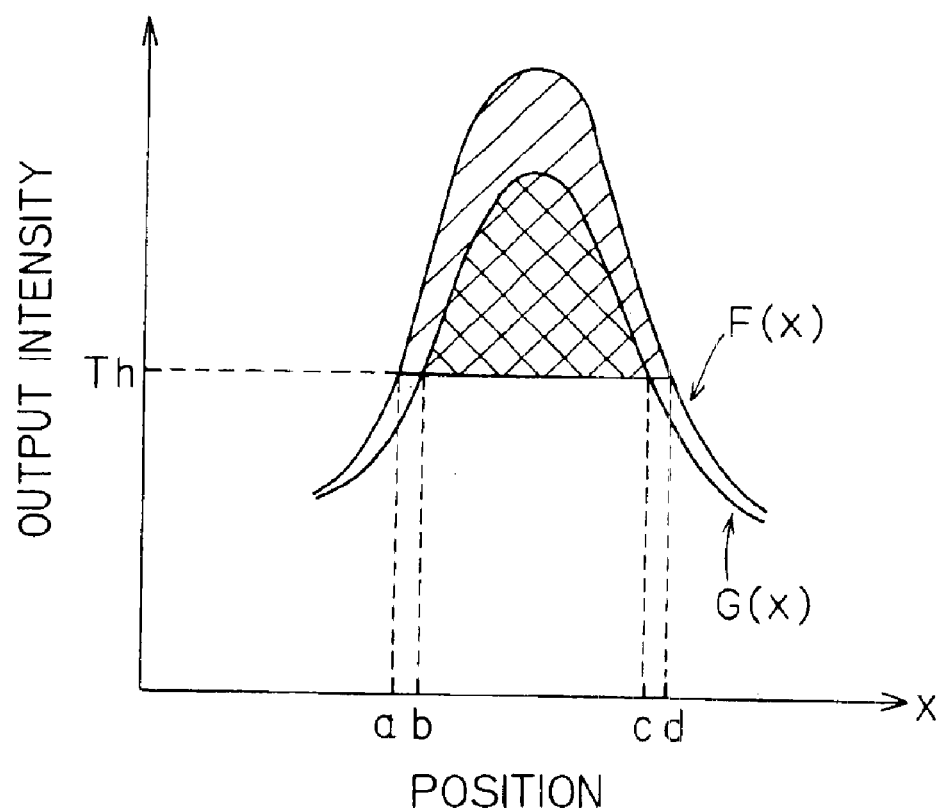
FIG. 11 illustrates an exemplary quantification method for light intensity reduction.

In the aforementioned method, the CPU 11 normalizes the waveform G(x) indicating the intensity of the light components emitted from the respective ones of the 27 flash lamps 69 when actually performing flash heating on the semiconductor wafer W to be processed with the waveform F(x) indicating the standard luminous intensity obtained by previously measuring the intensity of the light components emitted from the respective ones of the 27 flash lamps 69 when the irradiation state on the semiconductor wafer W satisfies the prescribed criterion thereby quantifying intensity reduction of the light components emitted from the flash lamps 69 and performing lamp management. However, the method of quantifying light intensity reduction by comparing the actual waveform G(x) with the waveform F(x) indicating the standard luminous intensity is not restricted to the aforementioned example but the following various methods are employable:

(Method 1) In an example shown in FIG. 11, a threshold Th common to the actually measured waveform G(x) as to the flash lamps 69 and the waveform F(x) indicating the standard luminous intensity is set for integrating a value obtained by subtracting the threshold Th from a part exceeding the threshold Th as to each of the waveforms G(x) and F(x) and quantifying light intensity reduction from the results of integration. In the example shown in FIG. 11, a light intensity reduction index R (%) of the light components emitted from the flash lamps 69 is calculated as follows:

$$R = \left[1 - \frac{\int_b^c (G(x) - Th)\,dx}{\int_a^d (F(x) - Th)\,dx}\right] \times 100 \qquad \text{[Equation 1]}$$

The value of the waveform G(x) is reduced and the intensity reduction index R is increased as the flash lamps 69 are deteriorated. Particularly in the example shown in FIG. 11, the values obtained by subtracting the threshold Th from the respective ones of the waveforms G(x) and F(x) are integrated, and hence it follows that an intensity reduction index R amplified with respect to deterioration of the flash lamps 69 is obtained. As to the threshold Th, a proper value may be set when determining the waveform F(x) indicating the standard luminous intensity so that the value is stored in the magnetic disk 14.

Figure 12:
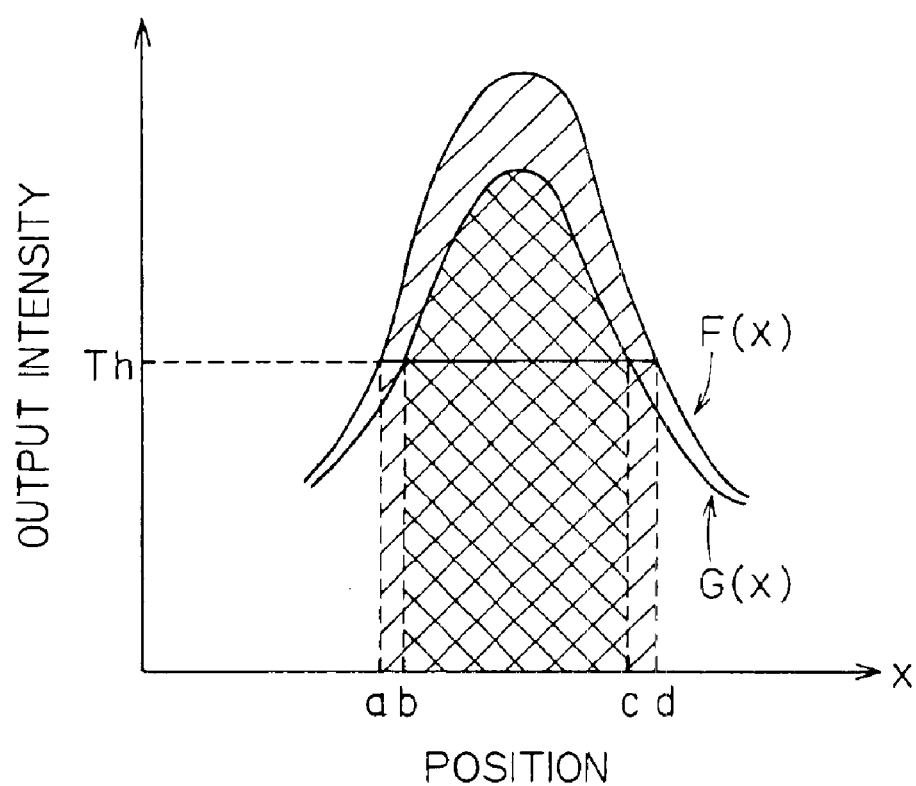
FIG. 12 illustrates another exemplary quantification method for light intensity reduction.

(Method 2) In an example shown in FIG. 12, a threshold Th common to the actually measured waveform G(x) as to the flash lamps 69 and the waveform F(x) indicating the standard luminous intensity is set for integrating a part exceeding the threshold Th as to each of the waveforms G(x) and F(x) and quantifying light intensity reduction from the results of integration. In the example shown in FIG. 12, a light intensity reduction index R (%) of the light components emitted from the flash lamps 69 is calculated as follows:

$$R = \left[1 - \frac{\int_b^c G(x)\,dx}{\int_a^d F(x)\,dx}\right] \times 100 \qquad \text{[Equation 2]}$$

Also in this case, the value of the waveform G(x) is reduced and the intensity reduction index R is increased as the flash lamps 69 are deteriorated. As to the threshold Th, a proper value may be set when determining the waveform F(x) indicating the standard luminous intensity similarly to the above.

Figure 13:
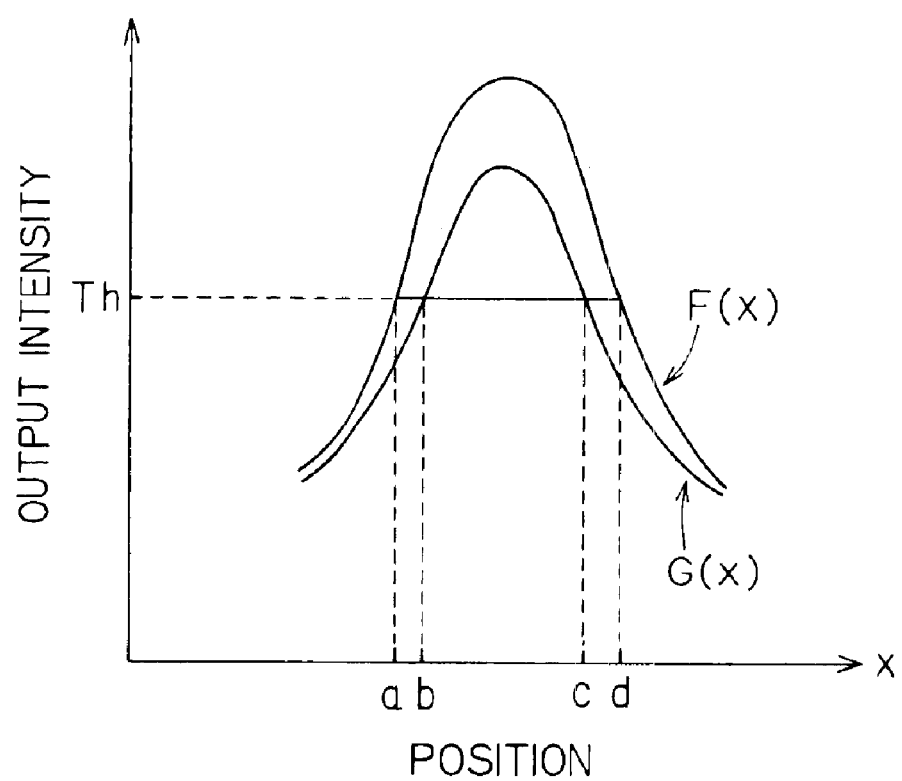
FIG. 13 illustrates still another exemplary quantification method for light intensity reduction.

(Method 3) In an example shown in FIG. 13, a threshold Th common to the actually measured waveform G(x) as to the flash lamps 69 and the waveform F(x) indicating the standard luminous intensity is set for obtaining the width of a part exceeding the threshold Th as to each of the waveforms G(x) and F(x) and quantifying light intensity reduction therefrom. In the example shown in FIG. 13, a light intensity reduction index R (%) of the light components emitted from the flash lamps 69 is calculated as follows:

$$R = \left(1 - \frac{c-b}{d-a}\right) \times 100 \qquad \text{[Equation 3]}$$

Also in this case, the value of the waveform G(x) is reduced, the width of the part exceeding the threshold Th is also narrowed and the intensity reduction index R is increased as the flash lamps 69 are deteriorated. As to the threshold Th, a proper value may be set when determining the waveform F(x) indicating the standard luminous intensity similarly to the above.

Figure 14:
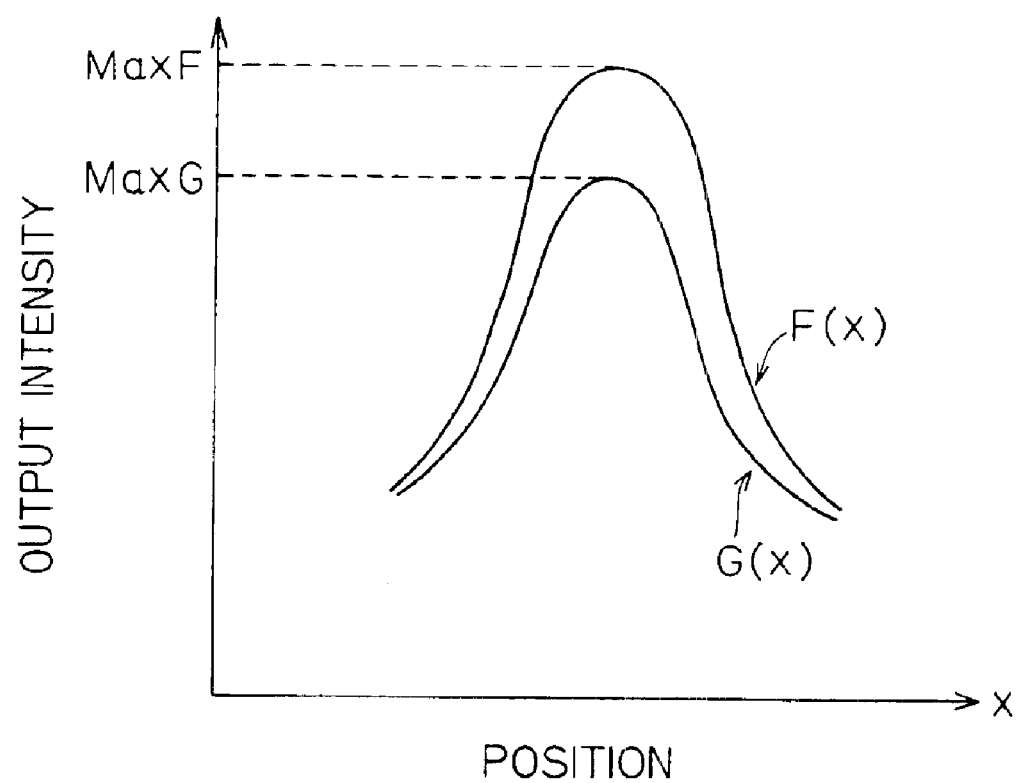
FIG. 14 illustrates a further exemplary quantification method for light intensity reduction.

(Method 4) In an example shown in FIG. 14, light intensity reduction is quantified from maximum values of the actually measured waveform G(x) as to the flash lamps 69 and the waveform F(x) indicating the standard luminous intensity. In the example shown in FIG. 14, a light intensity reduction index R (%) of the light components emitted from the flash lamps 69 is calculated as follows:

$$R = \left(1 - \frac{\text{Max } G}{\text{Max } F}\right) \times 100 \qquad \text{[Equation 4]}$$

Also in this case, the maximum value of the waveform G(x) is reduced and the intensity reduction index R is increased as the flash lamps 69 are deteriorated. In general, the cell positions of the maximum values of the waveforms F(x) and G(x) coincide with each other and hence this method is substantially synonymic for that described in the aforementioned embodiment.

Figure 15:
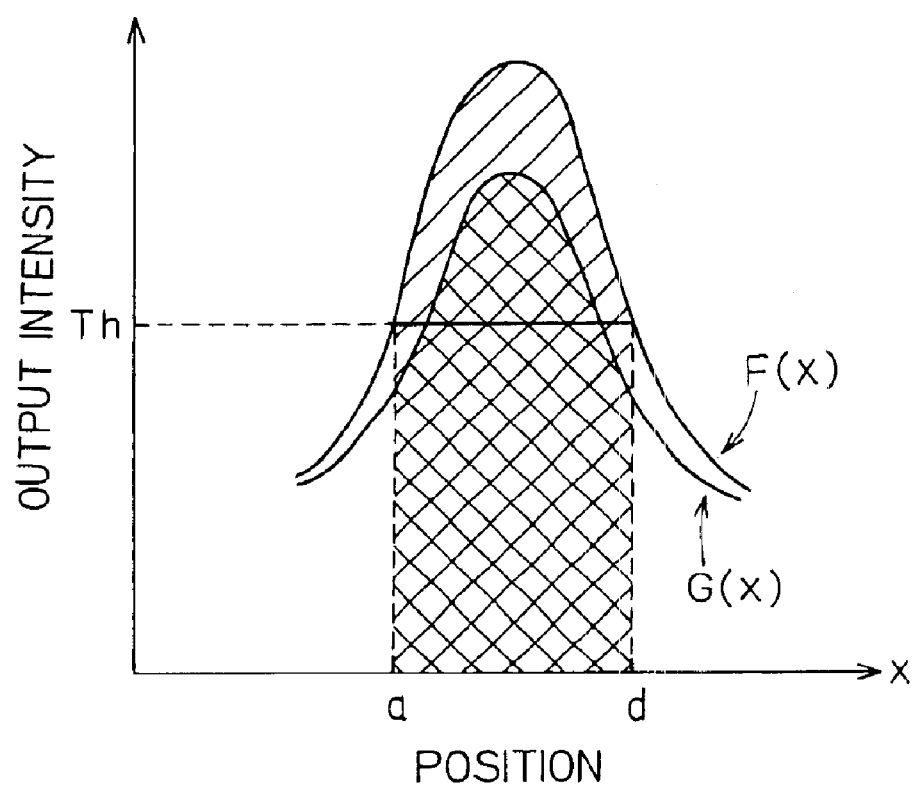
FIG. 15 illustrates a further exemplary quantification method for light intensity reduction.

(Method 5) In an example shown in FIG. 15, further, a threshold Th common to the actually measured waveform G(x) as to the flash lamps 69 and the waveform F(x) indicating the standard luminous intensity is set similarly to the above for integrating a part exceeding the threshold Th as to the waveform F(x) while integrating the waveform G(x) in the same range as the waveform F(x) and quantifying light intensity reduction from results of integration. In the example shown in FIG. 15, a light intensity reduction index R (%) of the light components emitted from the flash lamps 69 is calculated as follows:

$$R = \left[1 - \frac{\int_b^c G(x)\,dx}{\int_a^d F(x)\,dx}\right] \times 100 \qquad \text{[Equation 5]}$$

Also in this case, the value of the waveform G(x) is reduced and the intensity reduction index R is increased as the flash lamps 69 are deteriorated. As to the threshold Th, a proper value may be set when determining the waveform F(x) indicating the standard luminous intensity similarly to the above.

When the intensity reduction index R calculated according to any of these methods exceeds a prescribed value, the CPU 11 issues a warning about deterioration of the flash lamps 69 or stops the thermal processing apparatus similarly to the aforementioned embodiment. Each of the aforementioned quantification methods is performed as to each of the 27 flash lamps 69, i.e., in the vicinity of each of the cell positions P1, P2, P3, . . . .

Results of verification of the aforementioned five types of quantification methods are now described. The verification was performed with fluorescent tubes. A voltage (70 to 100 V) applied to the fluorescent tubes is proportionate to the light intensity thereof, and hence it is easy to adjust an actual light intensity reduction ratio Q (%). An actually measured waveform G(x) was acquired as to a plurality of light intensity reduction ratios Q for calculating the intensity reduction index R according to each of the aforementioned quantification methods. Calculation processing was performed five times as to each of the plurality of light intensity reduction ratios Q every method, for regarding the average of these five times as an intensity reduction index R.

Table 1 shows a coefficient a for forming a linear equation R=aQ with the intensity reduction index R and the light intensity reduction ratio Q obtained in the aforementioned manner by least square approximation every method. Table 1 also shows dispersion S obtained by averaging a fraction 3σ/AVE as to a plurality of light intensity reduction ratios Q assuming that σ represents standard deviation and AVE represents the average of the results of the aforementioned calculation processing performed five times.

TABLE 1

| | Coefficient a | Correlation Coefficient $r^2$ | Dispersion S (%) |
| --- | --- | --- | --- |
| Method 1 | 3.0022 | 0.9985 | 1.528 |
| Method 2 | 1.8921 | 0.9959 | 0.822 |
| Method 3 | 1.2884 | 0.9857 | 0.758 |
| Method 4 | 1.2042 | 0.9947 | 0.733 |
| Method 5 | 1.1975 | 0.9938 | 0.378 |

As clearly understood from Table 1, the method 1 has the largest coefficient a and is sensitive to light intensity change of the flash lamps 69. It is also understood that the method 5 has the smallest dispersion S with high repeatability and reliability of the intensity reduction index R. Thus, the characteristics of the respective methods are different from each other, and hence it is preferable to perform lamp management by combining a plurality of ones of the five types of quantification methods.

For example, it is possible to more correctly detect deterioration of the flash lamps 69 by monitoring the emission states of the flash lamps 69 according to the method 1 sensitive to light intensity change in general and performing confirmation according to the method 5 when detecting lamp deterioration. In order to more simply detect deterioration of the flash lamps 69, the emission states of the flash lamps 69 may be monitored according to only any one of the quantification methods. In order to perform more reliable detection, at least three of the five types of quantification methods may be combined for monitoring the emission states of the flash lamps 69, as a matter of course.

<2. Second Embodiment>

A thermal processing apparatus according to a second embodiment of the present invention is now described. The thermal processing apparatus according to the second embodiment also thermally processes a substrate such as a semiconductor wafer with flash light emitted from xenon flash lamps, and the overall structure thereof is also substantially similar to that of the thermal processing apparatus according to the first embodiment. However, the thermal processing apparatus according to the second embodiment is different from the thermal processing apparatus according to the first embodiment in a point that a lens imaging system is provided on a light intensity measuring mechanism.

Figure 16:
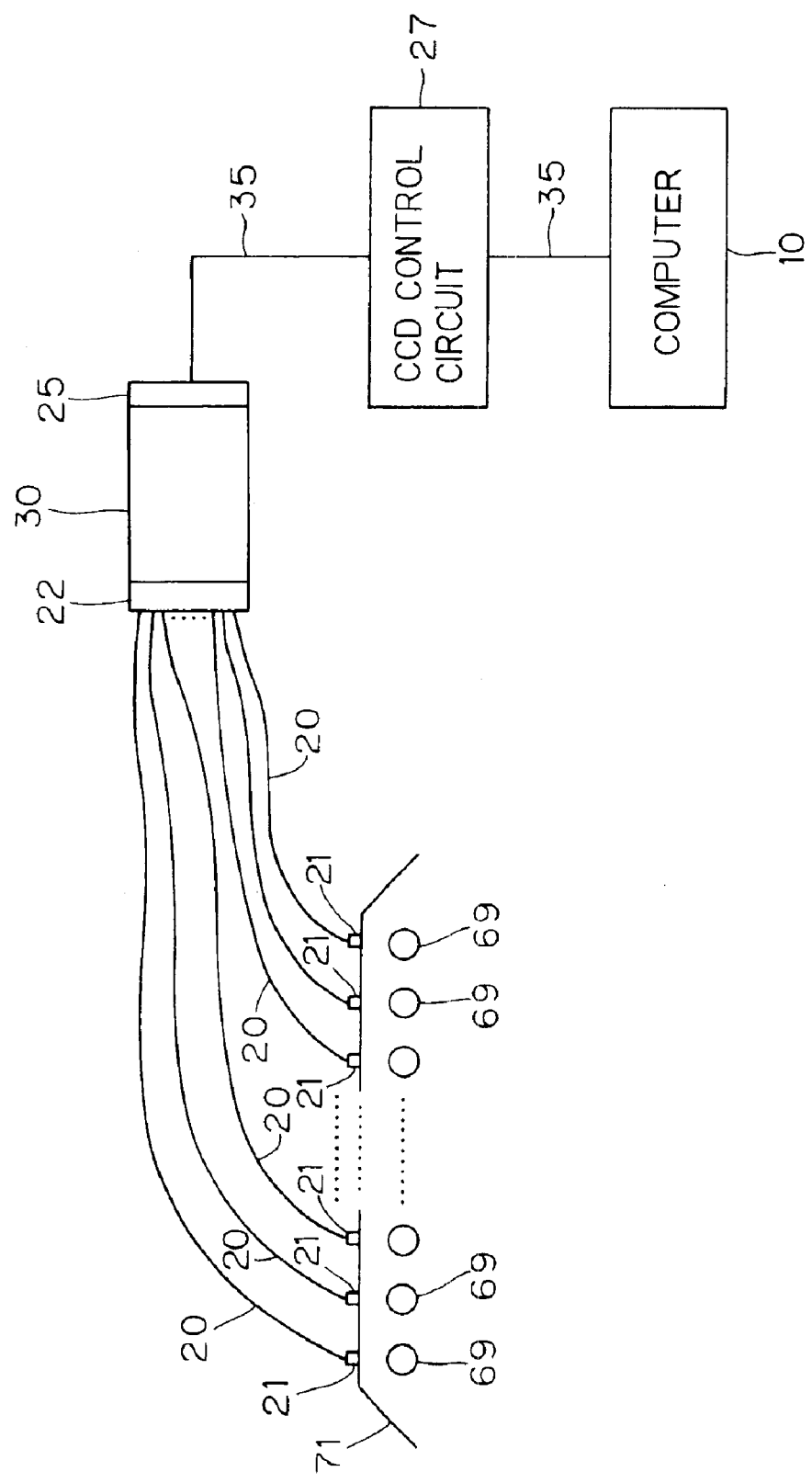
FIG. 16 schematically illustrates the structure of a light intensity measuring mechanism according to a second embodiment of the present invention.
Figure 17:
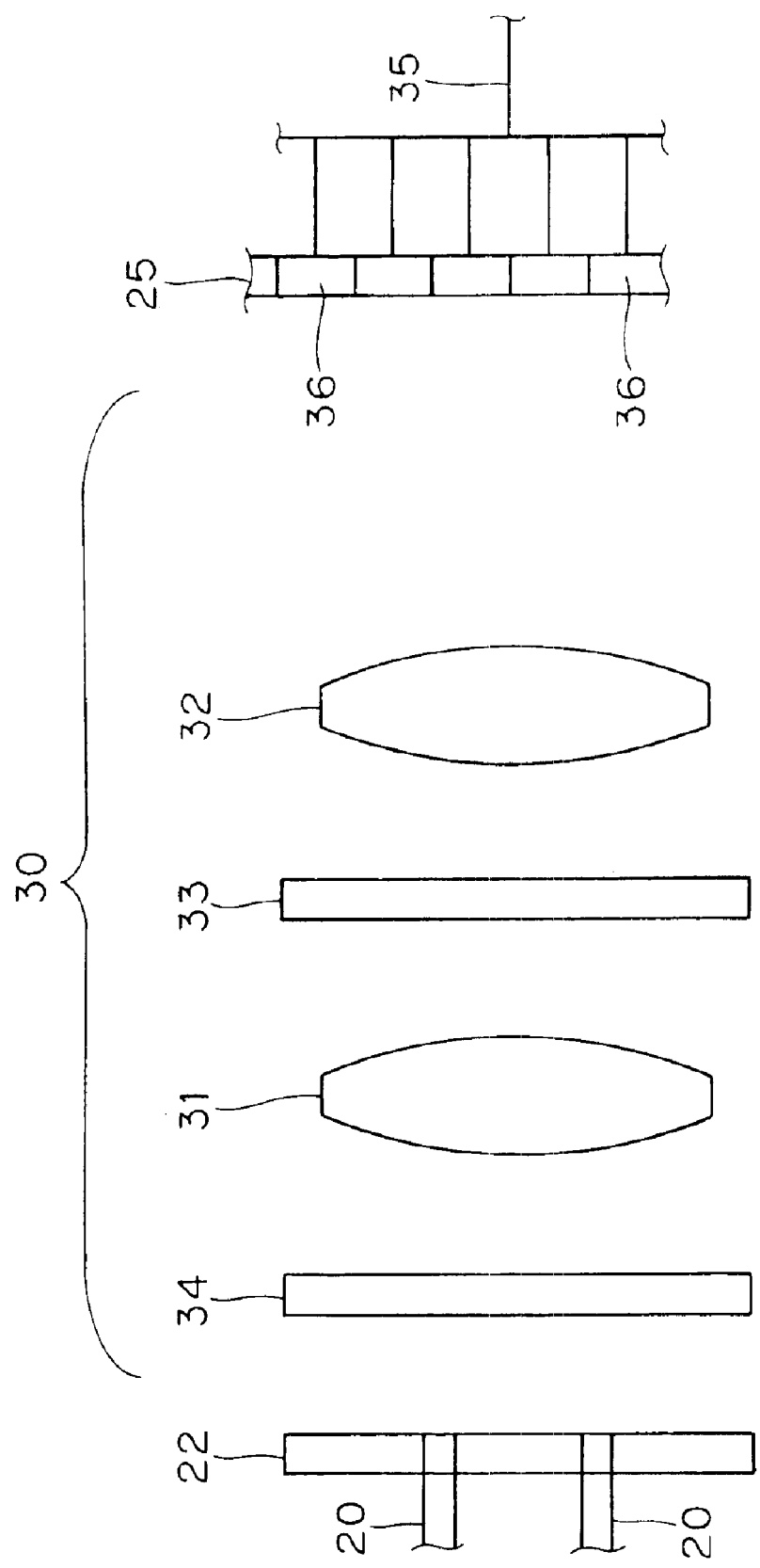
FIG. 17 illustrates the structure of an imaging part of the light intensity measuring mechanism shown in FIG. 16.

FIG. 16 schematically illustrates the structure of the light intensity measuring mechanism in the thermal processing apparatus according to the second embodiment. FIG. 17 illustrates the structure of an imaging part 30 shown in FIG. 16. The light intensity measuring mechanism in the thermal processing apparatus according to the second embodiment is formed by a plurality of optical fiber members 20 guiding light emitted from flash lamps 69, a CCD 25 outputting the intensity of received light as an electric signal, the imaging part 30 imaging the respective ones of light components emitted from the flash lamps 69 and guided through the corresponding optical fiber members 20 on CCD cells 36 of the CCD 25 and a computer 10 analyzing the electric signal output from the CCD 25.

First ends of the optical fiber members 20 are fixed to a reflector 71 in a mode absolutely identical to that in the first embodiment (see FIGS. 5 and 6). A plurality of, e.g., 81 optical fiber members 20 are attached to the reflector 71 in the mode identical to that shown in FIGS. 5 and 6, so that end surfaces of the optical fiber members 20 are opposed to the central portions and both ends of the 27 flash lamps 69. When the flash lamps 69 emit flash light in this state, it follows that the emitted light is incident upon the end surfaces of the respective optical fiber members 20 and guided by the optical fiber members 20. Thus, the optical fiber members 20 function as light introduction paths guiding light components emitted from the corresponding portions (the central portions, the first ends and the second ends) of the plurality of flash lamps 69.

Second ends of the respective optical fiber members 20 are also fixed to a fiber fixture 22, similarly to the first embodiment. Three columns of 27 optical fiber members 20 opposed to the central portions, first ends and second ends of the flash lamps 69 respectively are fixed to the fiber fixture 22. Thus, the fiber fixture 22 is used as a fixing part arranging the second ends of the optical fiber members 20 in a prescribed connection mode and fixing the same.

The light components (hereinafter also referred to as "introduced light components") incident upon first end surfaces opposed to the flash lamps 69 and guided through the corresponding optical fiber members 20 outgo from second end surfaces thereof with no hindrance by the fiber fixture 22, as a matter of course.

The imaging part 30 is an optical unit arranged between the fiber fixture 22 and the CCD 25 for imaging the light components emitted from the flash lamps 69 and guided through the optical fiber members 20 on the CCD cells 36 of eth CCD 25 with a plurality of lenses, i.e., first and second lenses 31 and 32. As shown in FIG. 17, the imaging part 30 is mainly formed by the first lens 31 arranged closer to the fiber fixture 22, the second lens 32 arranged closer to the CCD cells 36 and a light diffusion plate 34 diffusing the introduced light components emitted from the flash lamps 69 and guided by the respective optical fiber members 20.

The first and second lenses 31 and 32 form a lens group used for imaging the introduced light components transmitted through the light diffusion plate 34 on the CCD cells 36 of the CCD 25, and a filter 33 is arranged between the first and second lenses 31 and 32, as shown in FIG. 17.

The filter 33 can be prepared in response to the object thereof. For example, an ND filter may be employed if the light outgoing from the optical fiber members 20 is too intense, or a band-pass filter may be employed in order to narrow the target to a prescribed spectrum. In order to monitor only an ultraviolet spectrum remarkably contributing to flash heating, for example, a band-pass filter narrowing the target to the ultraviolet spectrum is employed. Alternatively, a filter coated with a fluorescent paint can be employed as the filter 33.

The light diffusion plate 34, which is a member diffusing the introduced light components progressing from the fiber fixture 22 toward the light diffusion plate 34 while transmitting the same therethrough, is a circular plate member having a size identical to or in excess of the diameter of the first and second lenses 31 and 32 or a square or rectangular plate member whose side has a length identical to or in excess of the diameter of the first and second lenses 31 and 32, as shown in FIG. 17.

As shown in FIG. 17, the light diffusion plate 34 is arranged between the fiber fixture 22 fixing the second ends of the plurality of optical fiber members 20 and the first lens 31 so that the central position thereof is in the vicinity of a straight line connecting the centers of the first and second lenses 31 and 32 with each other.

The light diffusion plate 34 of the thermal processing apparatus according to the second embodiment is made of a material such as quartz, for example, transmitting light, and the surfaces of an entrance plane and an exit plane for the introduced light components are roughly polished for diffusing the introduced light components in various directions. In other words, the entrance plane and the exit plane of the light diffusion plate 34 form light diffusion surfaces diffusing the introduced light components respectively. Thus, it follows that the introduced light components transmitted through the light diffusion plate 34 progress while diffusing in various directions to be incident upon the first lens 31.

The entrance plane and the exist plane of the light diffusion plate 34 in the thermal processing apparatus according to the second embodiment are so polished that average surface roughness (Ra) is 0.10 to 1.16 ($\mu$m), more preferably 0.10 to 0.15 ($\mu$m).

The CCD 25, formed by arranging photodiodes in a planar state, is a photodetector taking out a quantity of electricity proportionate to stored incident light, which is employed for measuring the intensity of received light. The CCD 25 is arranged oppositely to the fiber fixture 22 while sandwiching the imaging part 30 therebetween and can receive the light components outgoing from the 81 optical fiber members 20 and transmitted through the light diffusion plate 34, the first lens 31, the filter 33 and the second lens 32. The CCD 25 may alternatively be replaced with a CMOS (complementary metal oxide semiconductor) sensor or the like.

A CCD control circuit 27 controls reading of charges stored in the CCD 25. The electric signal read from the CCD 25 by the CCD control circuit 27 is transmitted to the computer 10 through a signal line 35. The computer 10 provided on the thermal processing apparatus has a hardware structure absolutely identical to that in the first embodiment (see FIG. 7).

Due to the aforementioned structure, the light intensity measuring mechanism of the thermal processing apparatus according to the second embodiment measures the intensity of the light components emitted from the flash lamps 69 by guiding the light components emitted from the flash lamps 69 through the first ends of the optical fiber members 20 and imaging the introduced light components outgoing from the second ends of the optical fiber members 20 on the CCD cells 36 of the CCD 25 by the imaging part 30 so that the computer 10 can analyze the results of measurement.

Thermal processing operations of the thermal processing apparatus according to the second embodiment having the aforementioned structure for a semiconductor wafer W themselves are identical to those in the first embodiment, and hence redundant description is omitted. However, the light intensity measuring mechanism in the thermal processing apparatus according to the second embodiment is different from that in the first embodiment, and hence difference resulting therefrom is now described.

When the flash lamps 69 emit flash light in flash heating, the optical fiber members 20 receive parts of the light. At this time, it follows that the optical fiber members 20 having the end surfaces opposed to the central portions and both ends of the flash lamps 69 individually receive light components emitted from the central portions and both ends of the flash lamps 69 respectively. The received light components are guided and emitted by the optical fiber members 20 and received by the CCD 25 through the light diffusion plate 34, the first lens 31, the filter 33 and the second lens 32.

The intensity of the electric signal read by formation of images of the introduced light components outgoing from the second ends of the optical fiber member 20 on the CCD cells 36 is now described. The following description is made while making comparison as to how the intensity of the electric signal read from the CCD 25 in response to the images of the introduced light components formed on the CCD cells 36 varies with the case of arranging the light diffusion plate 34 on the imaging part 30 and a case of arranging no light diffusion plate 34.

Figure 18:
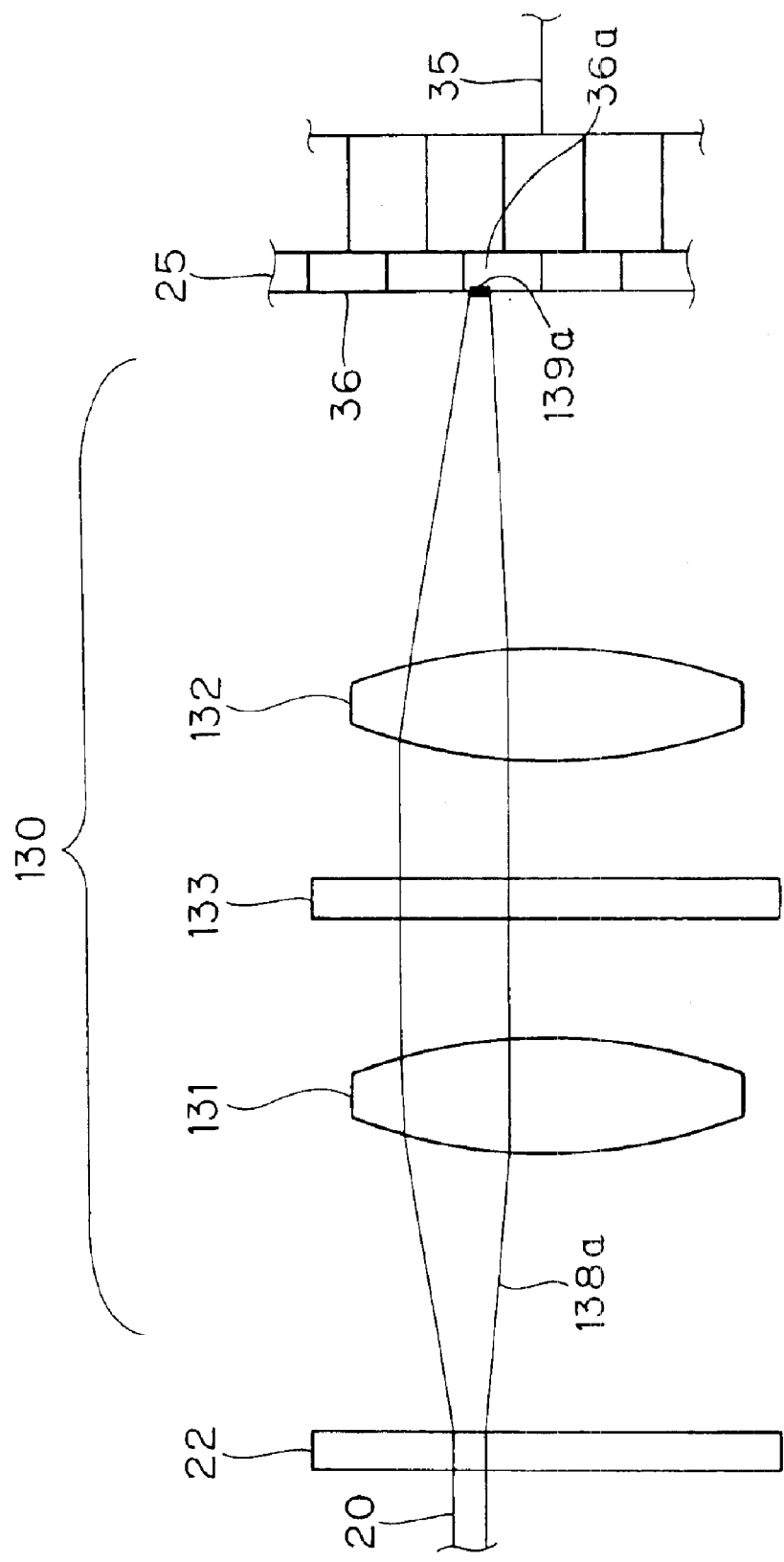
FIGS. 18 and 19 illustrate the structure of the imaging part employing no diffusion plate.
Figure 19:
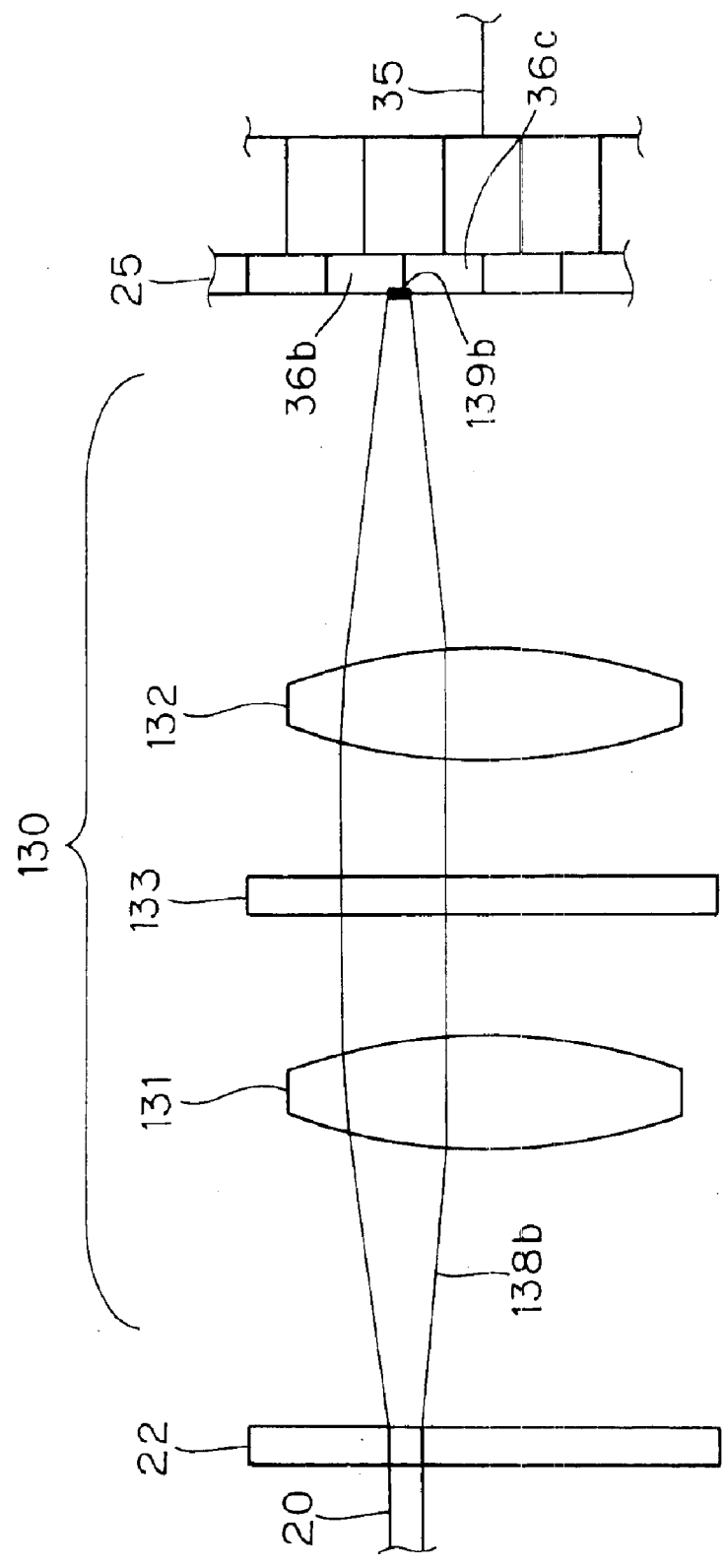
Figure 21:
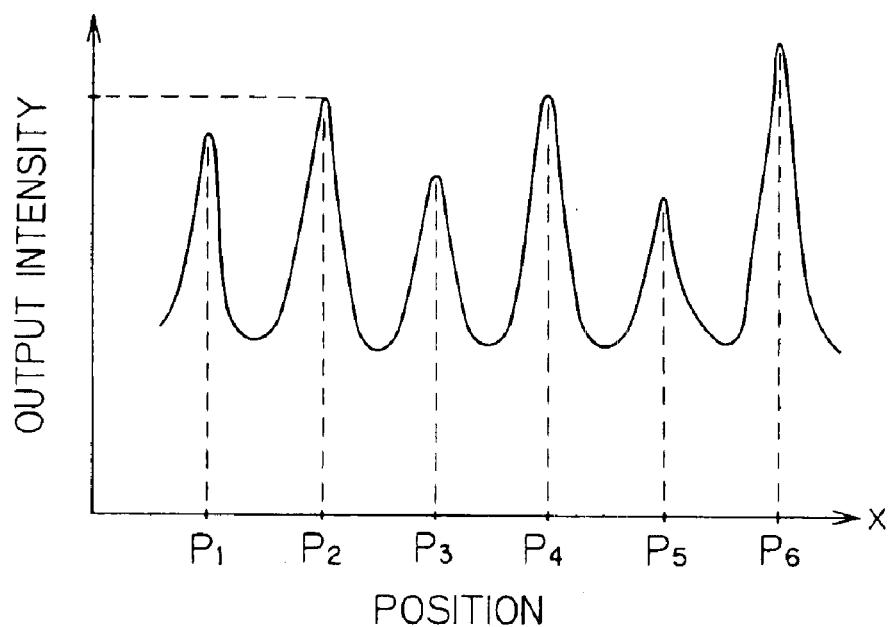
FIG. 21 illustrates an exemplary intensity waveform of an electric signal output from a CCD in the case employing no diffusion plate.

FIGS. 18 and 19 illustrate the structure of an imaging part 130 using no light diffusion plate 34. FIG. 21 illustrates an exemplary intensity waveform of an electric signal read from a CCD 25 in response to images of introduced light components when the imaging part 130 using no light diffusion plate 34 shown in FIGS. 18 and 19 forms the images of the introduced light components on CCD cells 36.

Figure 22:
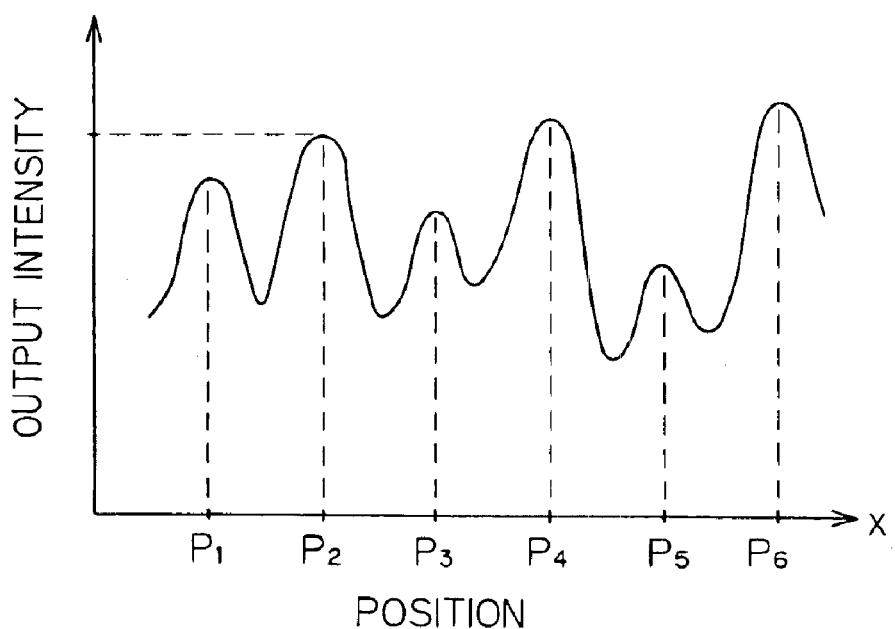
FIG. 22 illustrates an exemplary intensity waveform of an electric signal output from the CCD in a case employing a diffusion plate.

FIG. 22 illustrates an exemplary intensity waveform of the electric signal read from the CCD 25 in response to images of the introduced light components formed by the imaging part 30 using the light diffusion plate 34 shown in FIG. 17.

Referring to each of FIGS. 21 and 22, the horizontal axis shows the positions of the CCD cells 36 of the CCD 25, and the vertical axis shows the intensity of the electric signal output from the CCD 25. Further, symbols P1 to P6 denote cell positions located on the centers of light components emitted from the optical fiber members 20 in specific correspondence identical to that in the first embodiment. In other words, cell positions P1, P2, P3, P4, P5 and P6 are located on the centers of light components emitted from the central portions of flash lamps 69a, 69b, 69c, 69d, 69e and 69f respectively.

When no light diffusion plate 34 is employed, an introduced light component 138a (see FIG. 18) emitted from each flash lamp 69 to progress through the corresponding optical fiber member 20 and outgo from the other end of the optical fiber member 20 diverges in all directions toward the first lens 131. In other words, the introduced light component 138a radially diverges from a portion around the central portion of each optical fiber member 20. No obstacle is present between the fiber fixture 22 and the first lens 131, whereby the introduced light component 138a linearly progresses in all directions. Therefore, the first and second lenses 131 and 132 can efficiently condense the introduced light component 138a. Depending on the condensation state, therefore, it follows that a region around the central portion of an image of the introduced light component 138a formed by the imaging part 130 is condensed and imaged on a region smaller than a single CCD cell 36 forming the minimum unit of photodetectors provided on the CCD 25.

In this case, charges stored in each CCD cell 36 vary with a case where the region around the central portion of the image of the introduced light component is similar to an imaging region 139a of the introduced light component 138a shown in FIG. 18 and a case where the same is similar to an imaging region 139b of another introduced light component 138b shown in FIG. 19, for example. When the region is similar to the imaging region 139a shown in FIG.

18, it follows that light energy (light intensity) of the introduced light component 138a is converted to an electric signal by a single CCD cell 36a. When the region is similar to the image region 139b shown in FIG. 19, on the other hand, it follows that the light energy of the introduced light component 139a is converted to an electric signal by two CCD cells 36b and 36c.

Therefore, the intensity of the electric signal taken out from the CCD cell 36 varies with the case where the region for imaging the central portion of the introduced light component is included in a single CCD cell 36 and the case where the same extends over two CCD cells 36. In other words, it follows that the intensity of the electric signal taken out from the CCD cell 36 is dispersed depending on the imaging position of the region of the central portion of the introduced light component. Consequently, it follows that output intensity (i.e., maximum output intensity) on the respective positions P1 to P6 remarkably varies with the position where the region of the central portion of the introduced light component is imaged, as shown in FIG. 21.

When the light diffusion plate 34 is employed, on the other hand, an introduced light component 38 (see FIG. 20) emitted from each flash lamp 69 to progress through the corresponding optical fiber member 20 and outgo from the other end of the optical fiber member 20 diverges in all directions toward the light diffusion plate 34. In other words, the introduced light component 38 linearly progresses in all directions since no obstacle is present between the fiber fixture 22 and the light diffusion plate 34.

When reaching the light diffusion plate 34, the introduced light component 38 is incident upon the entrance plane of the light diffusion plate 34 polished to have a rough surface and diffused to be partially reflected and partially transmitted through the light diffusion plate 34. The introduced light component 38 transmitted through the light diffusion plate 34 is diffused again when outgoing from the exit plane of the light diffusion plate 34 toward the first lens 31. Thus, the light diffusion plate 34 has a function of changing the traveling direction of the introduced light component 38 by diffusing the same. Therefore, the introduced light component outgoing from the light diffusion plate 34 and entering the first lens 31 does not radially diverge from the central portion of each optical fiber member 20 dissimilarly to that not transmitted through the light diffusion plate 34.

Figure 20:
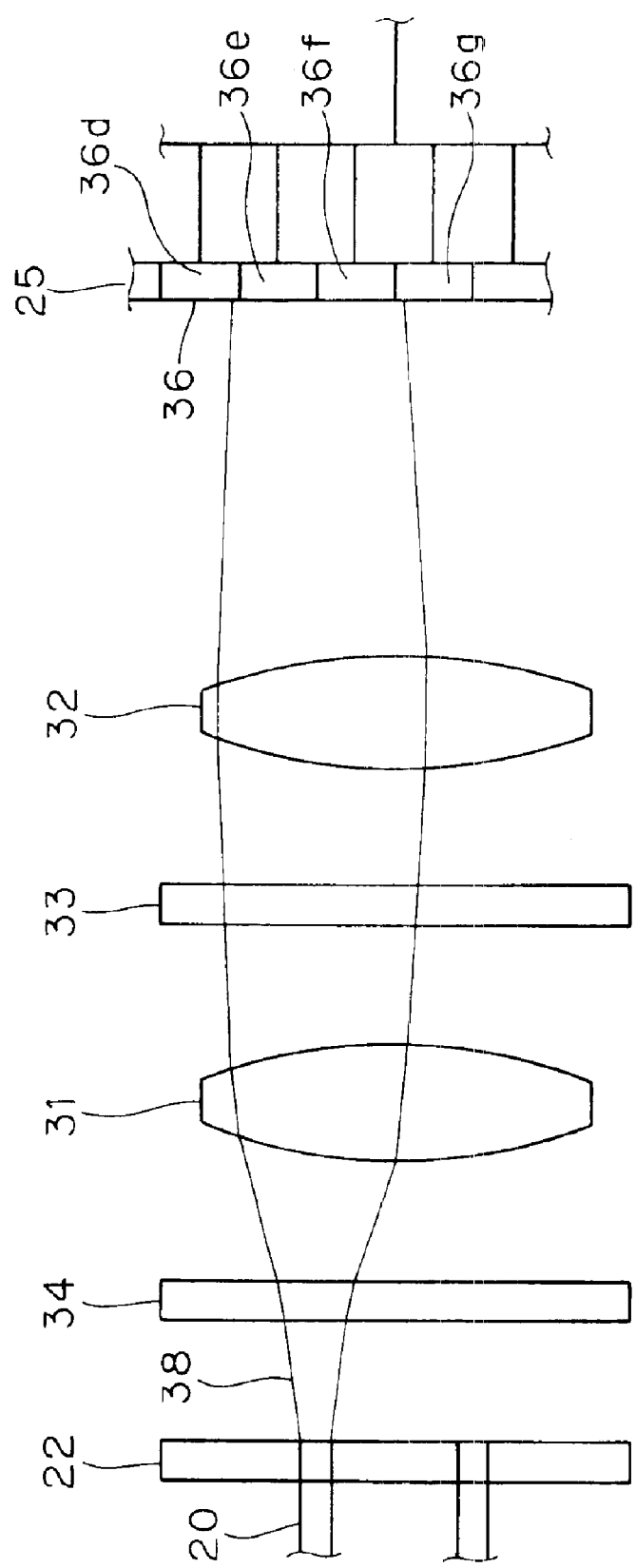
FIG. 20 illustrates the structure of the imaging part according to the second embodiment.

When a central region of the introduced light component 38 outgoing from the light diffusion plate 34 and entering the surface of the first lens 31 is imaged on the CCD cell 36 through the first and second lenses 31 and 32, therefore, an image of a portion around the central portion of the introduced light component 38 is widened as compared with that formed through no light diffusion plate 34, and formed over a plurality of CCD cells 36 (four CCD cells 36d to 36g in FIG. 20). It follows that the image of the portion around the central portion of the introduced light component 38 is formed entirely on the two CCD cells 36e and 36f among these CCD cells 36d to 36g. Consequently, it follows that the CCD cells 36e and 36f can stably convert the light energy (light intensity) of the introduced light component 38 and take out the same as the intensity of an electric signal, whereby output intensity (i.e., maximum output intensity) on the respective positions P1 to P6 can be stably measured as shown in FIG. 22 as compared with the case of employing no light diffusion plate 34, for suppressing dispersion of the output intensity and improving repeatability of the results of measurement.

As hereinabove described, it follows that the degree of condensation of the imaging part 30 is reduced, i.e., the size of the image of the central region of the introduced light component 38 is increased when the light diffusion plate 34 is employed as compared with the case of employing no light diffusion plate 34, and it also follows that the light energy (light intensity) of the image of the central region is dispersed. In other words, the output intensity distribution around the respective positions P1 to P6 shown in FIG. 22 in the case of employing the light diffusion plate 34 is so broadened that the CCD 25 can identify the maximum output intensity of the respective positions P1 to P6 as compared with the case of employing no light diffusion plate 34 shown in FIG. 21. In other words, the light diffusion plate 34 reduces the resolution of the imaging part 30 to a degree enabling identification of the maximum output intensity of the respective positions P1 to P6. Consequently, it follows that dispersion of values of results of measurement of the maximum output intensity of the respective positions P1 to P6 is suppressed and the repeatability is improved.

Therefore, the thermal processing apparatus according to the second embodiment of the present invention employs the imaging part 30 having the light diffusion plate 34 shown in FIG. 17 (FIG. 20) thereby monitoring the light intensity on the basis of the above. The thermal processing apparatus monitors the emission states of the flash lamps 69 by the same method as that in the first embodiment, i.e., by comparing an actually measured waveform G(x) with a waveform F(x) indicating standard luminous intensity and quantifying light intensity reduction.

As hereinabove described, the thermal processing apparatus according to the second embodiment can suppress dispersion of the intensity of the electric signal by imaging the introduced light components outgoing from the optical fiber members 20 on the CCD cells 36 of the CCD 25 by the imaging part 30 having the light diffusion plate 34 and measuring the intensity of the electric signal. When determining the emission states of the flash lamps 69 by the ratio of the intensity of the light components emitted from the plurality of flash lamps 69 for performing flash heating on the semiconductor wafer W to the standard luminous intensity, therefore, it is possible to suppress dispersion of the intensity ratio. Therefore, repeatability of intensity ratio measurement can be improved for correctly grasping the emission states of the flash lamps 69.

<3. Modifications>

While the embodiments of the present invention have been described, the present invention is not restricted to the aforementioned examples. For example, while the light source 5 comprises 27 flash lamps 69 in each of the aforementioned embodiments, the present invention is not restricted to this but the number of the flash lamps 69 can be arbitrarily set.

Light intensity measuring portions in each flash lamp 69 are not restricted to three portions either but at least one portion may be subjected to light intensity measurement. It is preferable to select the central portion of each flash lamp 69 for a single measuring portion. A plurality of measuring portions are preferably selected to include the central portion and both ends.

The technique according to the present invention is also applicable to a thermal processing apparatus comprising other types of lamps, such as halogen lamps, for example, on a light source 5 in place of the flash lamps 69 for heating a semiconductor wafer W by photoirradiation from these lamps. In other words, the intensity of light components emitted from a plurality of portions of each of a plurality of lamps may be measured for detecting the emission states of the plurality of lamps on the basis of results of measurement.

A specific method therefor is identical to those of the aforementioned embodiments, and deterioration of the lamps can be reliably and simply detected.

While the entrance plane and the exit plane of the light diffusion plate 34 employed in the second embodiment are so polished that the surface roughness (Ra) is 0.10 to 1.16 (μm) respectively, the present invention is not restricted to this but the surface roughness of the entrance plane and the exit plane is set in response to the resolution of the CCD 25 depending on the size of the CCD cells 36 or the state of condensation through the first and second lenses 31 and 32. When CCD cells are smaller in size and larger in resolution than the CCD cells 36 employed in the second embodiment, for example, the surface roughness of the entrance plane and the exit plane may be smaller than that in the second embodiment.

While the light diffusion plate 34 is arranged between the first lens 31 and the fiber fixture 22 in the second embodiment, the present invention is not restricted to this but the light diffusion plate 34 may alternatively be arranged between the second lens 32 and the CCD 25. Further, the light diffusion plate 34, singularly arranged on the imaging part 30 in the second embodiment, may alternatively be provided in plural.

While the light diffusion plate 34 is arranged in the imaging part 30 in the second embodiment, the present invention is not restricted to this but the light diffusion plate 34 may alternatively be arranged outside the imaging part 30 in the vicinity of the fiber fixture 22, for example.

While the light diffusion plate 34 is made of quartz in the second embodiment, the present invention is not restricted to this but the light diffusion plate 34 may alternatively be made of acrylic.

While the thermal processing apparatus according to the second embodiment employs the light diffusion plate 34 thereby reducing the resolution of the imaging part 30 to a degree enabling identification of the maximum output intensity of the positions P1 to P6, the present invention is not restricted to this. If the maximum output intensity of the positions P1 to P6 on the CCD 25 is determinable, the resolution of the imaging part 30 may be reduced by changing the distance between the imaging part 30 and the CCD 25 so that the position of the CCD 25 is not on the focusing position of the imaging part 30, i.e., the image of the introduced light component 38 is not focused. In this case, the light energy (light intensity) of the image of the central region of the introduced light component 38 imaged on the CCD cell 36 is averaged as compared with a case where the position of the CCD 25 is on the focusing position of the imaging part 30, whereby dispersion of intensity of the electric signal taken out from the CCD 25 can be suppressed.

While the thermal processing apparatus according to each of the aforementioned embodiments irradiates the semiconductor wafer W with light for performing ion activation, the substrate to be processed by the thermal processing apparatus according to the present invention is not restricted to the semiconductor wafer. The thermal processing apparatus according to the present invention may alternatively process a glass substrate formed with various silicon films such as a silicon nitride film, a polycrystalline silicon film etc., for example. For example, silicon is ion-implanted into a polycrystalline silicon film formed on a glass substrate by CVD for forming an amorphous silicon film, followed by formation of a silicon oxide film for serving as an antireflection coating. It is also possible to irradiate the overall surface of the amorphous silicon film with light by the thermal processing apparatus according to the present invention in this state for forming a polycrystalline silicon film by polycrystallizing the amorphous silicon film.

It is also possible to perform photoirradiation on a TFT substrate having a structure obtained by forming an underlayer silicon oxide film and a polysilicon film prepared by crystallizing amorphous silicon on a glass substrate and doping the polysilicon film with an impurity such as phosphorus or boron with the thermal processing apparatus according to the present invention for activating the impurity implanted in the doping step.

In general, such a glass substrate has a larger size as compared with the semiconductor wafer, and the thermal processing apparatus performs flash heating by repetitively emitting light from a single flash lamp while shifting the glass substrate little by little. Also in this case, it is possible to reliably and simply detect deterioration of the lamp by detecting the emission state of the single flash lamp similarly to the aforementioned embodiments.

While the invention has been shown and described in detail, the foregoing description is in all aspects illustrative and not restrictive. It is therefore understood that numerous modifications and variations can be devised without departing from the scope of the invention.

What is claimed is:

1. A thermal processing apparatus for irradiating a substrate with flash light for heating said substrate, comprising:
   a light source having a bar flash lamp having an elongated cylindrical shape;
   a holding element holding said substrate;
   a light intensity measuring element measuring the intensity of respective light components emitted from a plurality of portions of said flash lamp when said light source emits said light toward said substrate held by said holding element; and
   an emission state detection element detecting the emission state of said flash lamp on the basis of a result of measurement by said light intensity measuring element.

2. The thermal processing apparatus according to claim 1, wherein
   the intensity of light emitted from said flash lamp when the irradiation state on said substrate held by said holding element satisfies a prescribed criterion is regarded as standard luminous intensity, and
   said emission state detection element compares said result of measurement by said light intensity measuring element with said standard luminous intensity for detecting the emission state of said flash lamp.

3. The thermal processing apparatus according to claim 2, wherein
   said light intensity measuring element measures the intensity of light components emitted from a plurality of portions including both ends of said bar flash lamp.

4. The thermal processing apparatus according to claim 3, wherein
   said light source has a plurality of said flash lamps,
   said light intensity measuring element measures the light intensity of light components emitted from each of said plurality of flash lamps, and
   said emission state detection element detects the emission state of each of said plurality of flash lamps.

5. The thermal processing apparatus according to claim 4, further comprising an abnormality countermeasure element performing prescribed abnormality countermeasure processing when at least part of the emission states of the respective ones of said plurality of flash lamps detected by said emission state detection element does not satisfy said prescribed criterion.

6. The thermal processing apparatus according to claim 5, wherein
said emission state detection element detects the emission state of each of said plurality of flash lamps every time the thermal processing apparatus performs photoirradiation on a substrate to be processed.

7. The thermal processing apparatus according to claim 6, wherein
said light intensity measuring element includes:
a plurality of optical fiber members guiding light components emitted from the respective ones of said plurality of flash lamps, and
a single photodetector receiving said light components guided by said plurality of optical fiber members.

8. A thermal processing apparatus irradiating a substrate with light thereby heating said substrate, comprising:
a light source having a plurality of bar lamps;
a holding element holding said substrate;
a light intensity measuring element measuring the intensity of respective light components emitted from a plurality of portions of each of said plurality of bar lamps; and
an emission state detection element detecting the emission state of each of said plurality of lamps on the basis of results of measurement by said light intensity measuring element.

9. The thermal processing apparatus according to claim 8, wherein
the intensity of light emitted from each of said plurality of lamps when the irradiation state on said substrate held by said holding element satisfies a prescribed criterion is regarded as standard luminous intensity, and
said emission state detection element compares said results of measurement by said light intensity measuring element with said standard luminous intensity for detecting the emission state of each of said plurality of lamps.

10. The thermal processing apparatus according to claim 9, further comprising an abnormality countermeasure element performing prescribed abnormality countermeasure processing when at least part of the emission states of the respective ones of said plurality of lamps detected by said emission state detection element does not satisfy said prescribed criterion.

11. The thermal processing apparatus according to claim 10, wherein
said light intensity measuring element includes:
a plurality of optical fiber members guiding light components emitted from the respective ones of said plurality of lamps, and
a single photodetector receiving said light components guided by said plurality of optical fiber members.

12. A thermal processing apparatus irradiating a substrate with flash light thereby heating said substrate, comprising:
a light source having a plurality of flash lamps;
a holding element holding said substrate;
a light intensity measuring element receiving light components emitted from said plurality of flash lamps by a photodetector when said light source emits light toward said substrate held by said holding element for measuring the intensity of received said light components; and
an emission state detection element detecting the emission state of each of said plurality of flash lamps on the basis of a result of measurement by said light intensity measuring element, wherein
said light intensity measuring element has:
a plurality of light introduction parts guiding said light components emitted from said plurality of flash lamps, and
an imaging part provided between first ends of said plurality of light introduction parts opposed to second ends facing said plurality of flash lamps and said photodetector for imaging introduced light components received from said plurality of flash lamps, guided to said introduction parts through said second ends and emitted from said first ends on said photodetector, and
the resolution of said imaging part is so adjusted as to enable identification of said introduced light components received from said plurality of flash lamps imaged on said photoconductor respectively.

13. The thermal processing apparatus according to claim 12, wherein said imaging part has a diffusion plate diffusing said introduced light components.

14. The thermal processing apparatus according to claim 13, wherein
said imaging part has a lens group formed by a plurality of lenses, and
said diffusion plate is arranged oppositely to said photodetector while sandwiching said lens group therebetween.

15. The thermal processing apparatus according to claim 13, wherein
said imaging part has a lens group formed by a plurality of lenses, and
said diffusion plate is arranged between said lens group and said photodetector.

16. The thermal processing apparatus according to claim 13, wherein
said diffusion plate is made of quartz, while an incidence plane and an exit plane for said introduced light components form light diffusion surfaces.

17. The thermal processing apparatus according to claim 16, wherein
said light introduction parts are made of quartz.

* * * * *